United States Patent
Kawanami et al.

(10) Patent No.: US 9,209,401 B2
(45) Date of Patent: Dec. 8, 2015

(54) METHOD FOR MANUFACTURING ORGANIC EL ELEMENT, ORGANIC EL ELEMENT, ORGANIC EL DISPLAY PANEL, ORGANIC EL DISPLAY APPARATUS, AND ORGANIC EL LIGHT-EMITTING APPARATUS

(71) Applicant: JOLED INC., Tokyo (JP)

(72) Inventors: Yuko Kawanami, Osaka (JP); Takako Kurosawa, Nara (JP); Haruka Kusukame, Nara (JP)

(73) Assignee: JOLED INC, Tokyo (JP)

( * ) Notice: Subject to any disclaimer, the term of this patent is extended or adjusted under 35 U.S.C. 154(b) by 127 days.

(21) Appl. No.: 14/348,103

(22) PCT Filed: May 9, 2013

(86) PCT No.: PCT/JP2013/002987
§ 371 (c)(1),
(2) Date: Mar. 28, 2014

(87) PCT Pub. No.: WO2013/190764
PCT Pub. Date: Dec. 27, 2013

(65) Prior Publication Data
US 2015/0132878 A1 May 14, 2015

(30) Foreign Application Priority Data
Jun. 20, 2012 (JP) ................................ 2012-138358

(51) Int. Cl.
*H01L 21/00* (2006.01)
*H01L 51/00* (2006.01)
(Continued)

(52) U.S. Cl.
CPC ........ *H01L 51/0029* (2013.01); *H01L 27/3244* (2013.01); *H01L 51/001* (2013.01);
(Continued)

(58) Field of Classification Search
CPC ............ H01L 27/3244; H01L 27/3274; H01L 51/001; H01L 51/0025; H01L 51/0029; H01L 51/0059; H01L 51/5056; H01L 51/56

USPC .......................................... 438/27, 29, 46, 47
See application file for complete search history.

(56) References Cited

U.S. PATENT DOCUMENTS 5,443,922 A 8/1995 Nishizaki et al.
8,251,765 B2 * 8/2012 Ushikubo .............. C09K 11/06
313/503

(Continued)

FOREIGN PATENT DOCUMENTS

JP 01-219367 9/1989
JP 05-163488 6/1993
(Continued)

OTHER PUBLICATIONS

U.S. Appl. No. 14/237,928 to Yuko Kawanami, filed Feb. 10, 2014.
(Continued)

*Primary Examiner* — Kevin M Picardat
(74) *Attorney, Agent, or Firm* — Greenblum & Bernstein, P.L.C.

(57) ABSTRACT

Method for manufacturing organic EL element, including: reducing internal pressure of vacuum chamber by vacuum pump connected thereto in state where substrate with applied film formed thereon is placed in vacuum chamber, applied film having been formed by applying material of organic light-emitting layer to substrate; and purifying applied film having passed through reducing the internal pressure of the vacuum chamber. Diphenylamine is used in portion of vacuum pump that is connected to inside of vacuum chamber. Reducing internal pressure of vacuum chamber is performed such that molecules of diphenylamine fly from vacuum pump into vacuum chamber and some of molecules are taken into applied film, and purifying is performed so that content of diphenylamine in applied film is in range from more than 0 $nmol/cm^3$ to 13.8 $nmol/cm^3$.

13 Claims, 21 Drawing Sheets

(51) Int. Cl.
  *H01L 27/32* (2006.01)
  *H01L 51/56* (2006.01)
  *H01L 51/50* (2006.01)

(52) U.S. Cl.
  CPC ........ *H01L51/0025* (2013.01); *H01L 51/5056* (2013.01); *H01L 51/56* (2013.01); *H01L 51/0059* (2013.01); *H01L 51/5012* (2013.01)

(56) References Cited

U.S. PATENT DOCUMENTS 8,993,126 B2 * 3/2015 Nowatari ............ H01L 51/0078 257/40

2015/0141697 A1 * 5/2015 Osaka .................. C07C 211/54 564/428

FOREIGN PATENT DOCUMENTS

| | | |
|---|---|---|
| JP | 10-255981 | 9/1998 |
| JP | 2007-109602 | 4/2007 |
| JP | 2009-267299 | 11/2009 |
| WO | 2012/043774 | 4/2012 |

OTHER PUBLICATIONS

International Search Report for PCT/JP2013/002987, which was mailed on Jun. 11, 2013.

* cited by examiner (a)

(b)

(c)

(a)

(b)

(c)

Time A

Time B

Time C

METHOD FOR MANUFACTURING ORGANIC EL ELEMENT, ORGANIC EL ELEMENT, ORGANIC EL DISPLAY PANEL, ORGANIC EL DISPLAY APPARATUS, AND ORGANIC EL LIGHT-EMITTING APPARATUS

TECHNICAL FIELD

The present invention relates to a method for manufacturing an organic EL element by forming an organic light-emitting layer by a solution-deposition-type film forming method, etc.

BACKGROUND ART

In recent years, progress has been made in the research and development of organic EL elements that use the phenomenon of electroluminescence occurring in solid fluorescent materials. Being self-light-emissive, the organic EL elements have characteristics such as a fast response speed, a wide viewing angle, a high contrast and the like. Each organic EL element includes a lamination of a pair of an anode and a cathode, and an organic light-emitting layer therebetween. The organic light-emitting layer causes the phenomenon of electroluminescence to occur by recombination of carriers (holes and electrons).

As a method for forming a film of the organic light-emitting layer, there is known a solution-deposition-type film forming method (see, for example, Patent Literature 1). The solution-deposition-type film forming method is considered to be preferable from the point of view of the mass production. In the solution-deposition-type film forming method, an organic light-emitting layer material, which contains a solvent and a material constituting the organic light-emitting layer, is applied onto the substrate by the ink jet method (liquid droplet ejection method) or the like, and the organic light-emitting layer is formed by drying the applied organic light-emitting layer material by using a vacuum apparatus (see, for example, Patent Literature 2). The vacuum apparatus used in this procedure is mainly a vacuum apparatus that has a vacuum chamber and a vacuum pump. For drying the organic light-emitting layer material, a substrate with an applied film of the organic light-emitting layer material formed thereon is placed in the vacuum chamber whose internal pressure has been reduced by the vacuum pump. The vacuum apparatus is also used to house the organic light-emitting layer that has been formed by the drying, until the next procedure is performed.

In general, a lubricant, a vacuum sealing material and the like are used in a portion of the vacuum pump that is connected to the inside of the vacuum chamber. Furthermore, the lubricant, the vacuum sealing material and the like contain an antioxidant for preventing the materials constituting the lubricant, the vacuum sealing material and the like from oxidizing.

CITATION LIST

Patent Literature

Patent Literature 1: Japanese Patent Application Publication No. 2009-267299
Patent Literature 2: Japanese Patent Application Publication No. H1-219367

SUMMARY OF INVENTION

Technical Problem

During the pressure reduction procedure executed in the process of forming the organic light-emitting layer by the solution-deposition-type film forming method, the performance of the organic light-emitting layer may be deteriorated, for example, due to an outgas from a material used in a portion of the vacuum pump that is connected to the inside of the vacuum chamber.

It is therefore an object of the present invention to suppress, as much as possible, the deterioration of the performance of the organic light-emitting layer that is apt to occur due to impurities that exist during the pressure reduction procedure in the process of forming the organic light-emitting layer by the solution-deposition-type film forming method.

Solution to Problem

According to one aspect of the present invention, there is provided a method for manufacturing an organic EL element, the method comprising: reducing an internal pressure of a vacuum chamber by a vacuum pump connected thereto in a state where a substrate with an applied film formed thereon is placed in the vacuum chamber, the applied film having been formed by applying a material of an organic light-emitting layer to the substrate; and purifying the applied film having passed through the reducing the internal pressure of the vacuum chamber, wherein diphenylamine is used in a portion of the vacuum pump that is connected to an inside of the vacuum chamber, the reducing the internal pressure of the vacuum chamber is performed such that molecules of diphenylamine fly from the vacuum pump into the vacuum chamber and some of the molecules are taken into the applied film, and the purifying is performed so that content of diphenylamine in the applied film is in a range from more than 0 nmol/cm$^3$ to 13.8 nmol/cm$^3$.

Advantageous Effects of Invention

The above-described method for manufacturing an organic EL element can suppress at least the deterioration of the performance of the organic light-emitting layer that is apt to occur due to an outgas containing diphenylamine and the like that is emitted from a material used in the portion of the vacuum pump that is connected to the inside of the vacuum chamber.

It is thus possible to suppress, as much as possible, the deterioration of the performance of the organic light-emitting layer due to the pressure reduction procedure during the process of forming the organic light-emitting layer by the solution-deposition-type film forming method.

BRIEF DESCRIPTION OF DRAWINGS

FIGS. 6A-6C are diagrams illustrating an example of the manufacturing process of the organic EL display panel of the embodiment.

DESCRIPTION OF EMBODIMENTS

<<Outline of One Aspect of Invention>>

Figure 1:
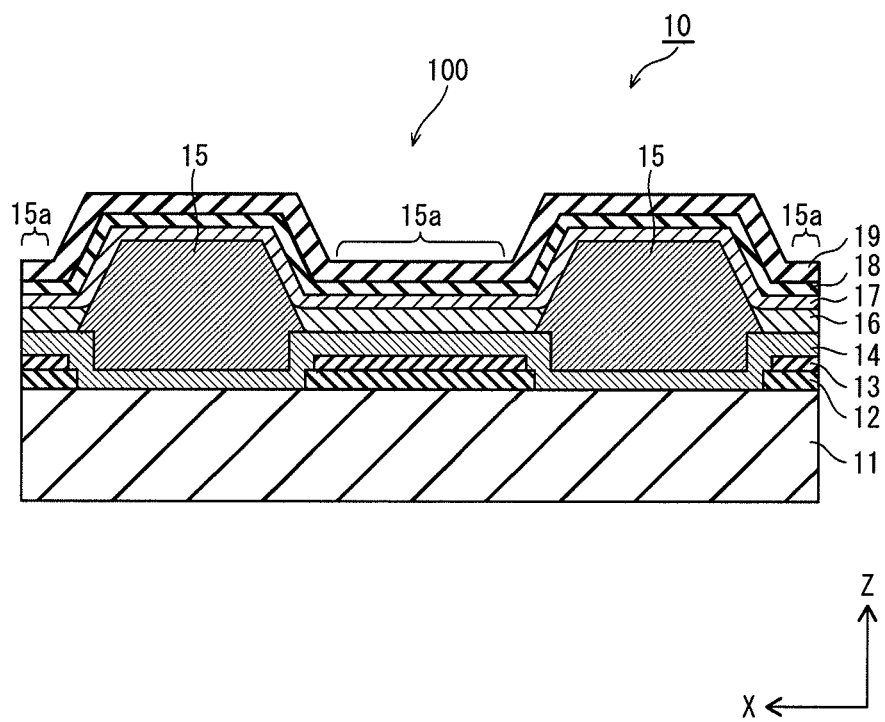
FIG. 1 is a partial cross-sectional view illustrating the structure of an organic EL display panel 10.

According to one aspect of the present invention, there is provided a method for manufacturing an organic EL element, the method comprising: reducing an internal pressure of a vacuum chamber by a vacuum pump connected thereto in a state where a substrate with an applied film formed thereon is placed in the vacuum chamber, the applied film having been formed by applying a material of an organic light-emitting layer to the substrate; and purifying the applied film having passed through the reducing the internal pressure of the vacuum chamber, wherein diphenylamine is used in a portion of the vacuum pump that is connected to an inside of the vacuum chamber, the reducing the internal pressure of the vacuum chamber is performed such that molecules of diphenylamine fly from the vacuum pump into the vacuum chamber and some of the molecules are taken into the applied film, and the purifying is performed so that content of diphenylamine in the applied film is in a range from more than 0 nmol/cm$^3$ to 13.8 nmol/cm$^3$.

In a predetermined situation of the method for manufacturing an organic EL element, during the purifying, the applied film having passed through the reducing the internal pressure of the vacuum chamber is heated so that content of diphenylamine in the applied film is in the range from more than 0 nmol/cm$^3$ to 13.8 nmol/cm$^3$.

In another predetermined situation of the method for manufacturing an organic EL element, during the purifying, the applied film having passed through the reducing the internal pressure of the vacuum chamber is heated so that content of diphenylamine in the applied film is at least 3.0 nmol/cm$^3$.

In a further predetermined situation of the method for manufacturing an organic EL element, in an x-y orthogonal coordinate system with an x axis representing heating temperature in ° C. set for the purifying, and with a y axis representing heating time in minutes set for the purifying, a combination of a heating temperature and a heating time set for the purifying is selected from among pairs of x coordinate value and y coordinate value that belong to a region above a curve represented by a quadratic function $y=0.0146x^2-5.5x+528.54$, the region including the curve.

In a further predetermined situation of the method for manufacturing an organic EL element, during the purifying, the heating temperature is at least 130° C. and at most 180° C., and the heating time is at most 60 minutes.

In a further predetermined situation of the method for manufacturing an organic EL element, during the purifying, the heating temperature is at most 170° C.

In a further predetermined situation of the method for manufacturing an organic EL element, diphenylamine contained in the organic light-emitting layer functions as a hole transporting material that promotes at least transportation of holes.

In a further predetermined situation of the method for manufacturing an organic EL element, a lubricant has been applied to a driving unit that drives the vacuum pump, the lubricant containing a lubricating component and an antioxidant for preventing the lubricating component from oxidizing, and diphenylamine is contained in the lubricant as the antioxidant.

In a further predetermined situation of the method for manufacturing an organic EL element, the vacuum pump is connected with the vacuum chamber by a connector, a vacuum sealing material being inserted between the connector and the vacuum chamber, and the vacuum sealing material containing a resin material and an antioxidant for preventing the resin material from oxidizing, and diphenylamine is contained in the vacuum sealing material as the antioxidant.

According to another aspect of the present invention, there is provided an organic EL element comprising: a substrate with a first electrode formed on an upper surface thereof; an organic light-emitting layer formed above the substrate; and a second electrode formed above the organic light-emitting layer, wherein the organic light-emitting layer has a diphenylamine content in a range from 3.0 nmol/cm$^3$ to 13.8 nmol/cm$^3$.

According to a further aspect of the present invention, there is provided an organic EL display panel including an organic EL element manufactured by the method described above.

According to a further aspect of the present invention, there is provided an organic EL display apparatus including an organic EL element manufactured by the method described above.

According to a further aspect of the present invention, there is provided an organic EL light-emitting apparatus including an organic EL element manufactured by the method described above.

Embodiment

[Structure of Organic EL Display Panel]

FIG. 1 is a partial cross-sectional view illustrating the structure of an organic EL display panel 10. The organic EL display panel 10 is a so-called top-emission organic EL display panel where a display surface is provided on the upper side thereof, and the main structural elements include anodes 12, organic light-emitting layers 16, an electron transport layer 17, and a cathode 18. In the organic EL display panel 10, an organic EL element, which includes an organic light-emitting layer 16 that corresponds to one of luminescent colors red (R), green (G), and blue (B), is treated as one sub-pixel 100, and a plurality of sub-pixels 100 are arranged in a matrix.

<Substrate 11, Anodes 12, ITO Layers 13>

The substrate 11 is a base member of the organic EL display panel 10 and may be formed from any of insulating materials: alkali-free glass, soda glass, non-fluorescent glass, phosphate glass, borate glass, quartz, acrylic resin, styrenic resin, polycarbonate resin, epoxy resin, polyethylene, polyester, silicone resin, alumina, etc.

Although not illustrated, a thin-film transistor (TFT) for driving the organic EL element is provided on the surface of the substrate 11, and the anodes 12 as the first electrode are provided on the TFT. The anodes 12 may be formed from, for example, ACL (an alloy of aluminum, cobalt and lanthanum), APC (an alloy of silver, palladium and copper), ARA (an alloy of silver, rubidium and gold), MoCr (an alloy of molybdenum and chromium), NiCr (an alloy of nickel and chromium), etc.

The ITO (Indium Tin Oxide) layer 13 is provided between the anodes 12 and a hole injection layer 14, and has a function to provide excellent connection between the layers.

<Hole Injection Layer 14>

The hole injection layer 14 is a layer formed from, for example, an oxide of silver (Ag), molybdenum (Mo), chromium (Cr), vanadium (V), tungsten (W), nickel (Ni), iridium (Ir), etc., or a conductive polymer material such as PEDOT (a mixture of polythiophene and polystyrene sulfonate). When formed from a metal oxide among the above-mentioned materials, the hole injection layer 14 has a function to inject holes into the organic light-emitting layers 16 stably or by assisting with generation of holes.

<Banks 15>

On the surface of the hole injection layer 14, banks 15 are formed to demarcate openings 15a below which the organic light-emitting layers 16 are formed, respectively. The banks 15 are formed to have a predetermined trapezoidal shape in cross section, and made of an insulating organic material (e.g., acrylic resin, polyimide resin, novolac-type phenolic resin, etc.).

Figure 2:
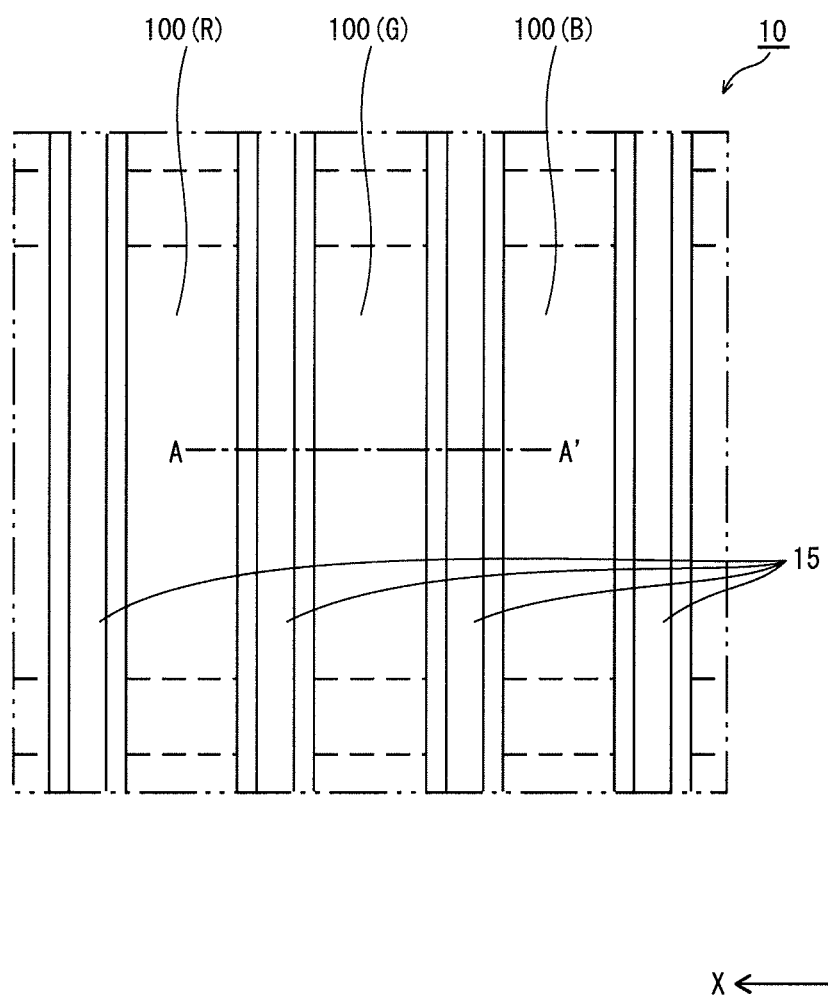
FIG. 2 is a schematic plan view illustrating the banks 15 in the organic EL display panel 10.

FIG. 2 is a schematic plan view illustrating the banks 15 in the organic EL display panel 10. In the organic EL display panel 10 of the present embodiment, a line bank structure is adopted and a plurality of linear banks 15 are formed. More specifically, the banks 15 each extend along the Y axis and demarcate the adjacent sub-pixels 100 in the X axis direction. The sub-pixels 100 in each pixel are formed so that adjacent regions partitioned by banks 15 have different luminescent colors. For example, three sub-pixels 100 having three different luminescent colors of red (R), green (G), and blue (B) form one pixel.

Note that FIG. 1 is a partial cross-sectional view taken along the line A-A' of FIG. 2.

<Organic Light Emitting Layer 16>

Back to FIG. 1, on the surface of each region of the hole injection layer 14 in each opening 15a demarcated by the banks 15, one organic light-emitting layer 16 corresponding to any of luminescent colors R, G and B is formed. Each organic light-emitting layer 16 emits light by recombination of carriers, and contains an organic material corresponding to any of the colors R, G and B.

Examples of the materials that can be used in the organic light-emitting layer 16 include F8-F6 (a copolymer of F8 (poly dioctylfluorene) and F6 (poly dihexylfluorene)), as well as poly-para-phenylene vinylene (PPV), polyfluorene, and fluorescent materials described in Japanese Patent Application Publication No. H5-163488 such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group III metal, metal complex of oxine, rare earth metal complex, etc.

The organic light-emitting layers 16 of the present embodiment are formed by a manufacturing method that is described below. Accordingly, only a small amount of materials, which are produced by the pressure reduction procedure, are present between the organic light-emitting layer 16 and the electron transport layer 17 that is formed on the layer 16. Thus, since the organic light-emitting layer 16 is hardly deteriorated by the materials that are present between the layers 16 and 17, it is possible to suppress the deterioration of the performance of the organic light-emitting layer 16 that is caused by the pressure reduction procedure. In addition to this, it is possible to reduce the influence of the materials on the electron transport layer 17 that is formed on the organic light-emitting layer 16. As a result, the organic light-emitting layer 16 of the present embodiment has excellent light-emitting characteristics.

Furthermore, by forming the organic light-emitting layers 16 by the manufacturing method that is described below, it is possible to cause the organic light-emitting layers 16 to contain a material that has a function to promote at least transportation of holes. Accordingly, since the movement of the holes in the organic light-emitting layers 16 is promoted, the light-emitting characteristics of the organic EL element are further improved, compared to the case where the organic light-emitting layers 16 is manufactured by a manufacturing method that is different from the manufacturing method described below.

<Electron Transport Layer 17>

The electron transport layer 17 has a function to transport electrons, which are injected from the cathode 18, to the organic light-emitting layers 16. The electron transport layer 17 is formed from a material having electron transportability (electron transporting material), and examples of the electron transporting materials include nitro-substituted fluorenone derivative, thiopyran dioxide derivative, diphenoquinone derivative, perylenetetracarboxyl derivative, anthraquinodimethane derivative, fluorenylidenemethane derivative, anthrone derivative, oxadiazole derivative, perynone derivative, quinolone complex derivative, etc., as described in Japanese Patent Application Publication No. H5-163488.

<Cathode 18>

In the present embodiment, to realize a top-emission organic EL display panel, the cathode 18, which is formed on the electron transport layer 17, may be made of a light-transmissive, conductive oxide such as ITO or IZO (Indium Zinc Oxide).

<Sealing Layer 19>

A sealing layer 19 is formed on the cathode 18 to protect the organic light-emitting layers 16 and the cathode 18 from water or oxygen that may penetrate into the organic EL display panel 10. Since the organic EL display panel 10 is a top-emission type, the sealing layer 19 may be formed from a light-transmissive material such as SiN (silicon nitride) or SiON (silicon oxynitride).

<Others>

Although not illustrated in particular, a sealing substrate may be provided above the sealing layer 19 so as to be facing the substrate 11. Furthermore, a space formed between the sealing layer 19 and the sealing substrate may be filled with an insulative material. This structure prevents water or oxygen from penetrating into the organic EL display panel 10. Since the organic EL display panel 10 is a top-emission type, the insulative material needs to be a light-transmissive material such as SiN or SiON.

Furthermore, a hole transport layer, which has a function to promote transportation of holes from the hole injection layer 14 to the organic light-emitting layers 16, may be formed between the hole injection layer 14 and the organic light-emitting layers 16. Examples of possible materials of the hole transport layer include triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styrylanthracene derivative, fluorenone derivative, hydrazone derivative, stilbene derivative, porphyrin compound, aromatic tertiary amine compound, styrylamine compound, butadiene compound, polystyrene derivative, hydrazone derivative, triphenylmethane derivative, tetraphenyl benzine derivative, etc. as described in Japanese Patent Application Publication No. H5-163488.

Furthermore, an electron injection layer, which has a function to promote injection of electrons from the cathode 18 to the electron transport layer 17, may be formed between the electron transport layer 17 and the cathode 18. Examples of possible materials of the electron injection layer include barium, phthalocyanine, lithium fluoride, etc.

[Manufacturing Method of Organic EL Display Panel]

FIGS. 3A-6C are diagrams illustrating an example of the manufacturing process of the organic EL display panel 10 of the present embodiment. The following describes the manufacturing process of the organic EL display panel 10 with reference to these drawings.

<Preparation Procedure>

First, a preparation procedure is performed to prepare the substrate 11 with a film formed thereon by applying an organic light-emitting layer material that contains a solvent and a material constituting the organic light-emitting layer 16. Note that FIGS. 3A-4A correspond to the preparation procedure.

Figure 3A:
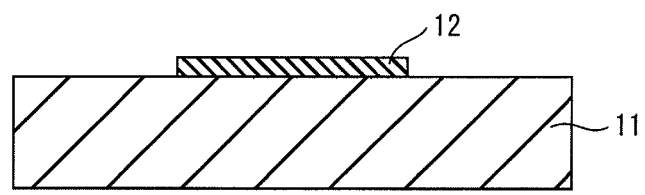
FIGS. 3A-3C are diagrams illustrating an example of the manufacturing process of the organic EL display panel of the embodiment.

First, as illustrated in FIG. 3A, the substrate 11 is placed in a film-forming vessel of a sputter film-forming apparatus. A predetermined sputtering gas is introduced into the film-forming vessel, and the anodes 12 are formed by the reactive sputtering method, vacuum deposition method or the like.

Figure 3B:
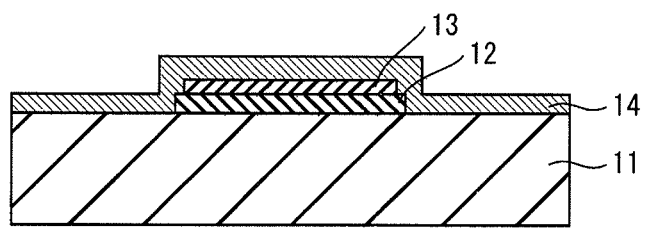

Subsequently, in the film-forming vessel, as illustrated in FIG. 3B, the ITO layers 13 are respectively formed on the anodes 112 by the sputtering method. Next, a metal film is formed by the sputtering method or the like to cover the surface of the substrate 11 including the surfaces of the ITO layers 13. Subsequently, the hole injection layer 14 is formed by oxidizing the formed metal film.

Figure 3C:
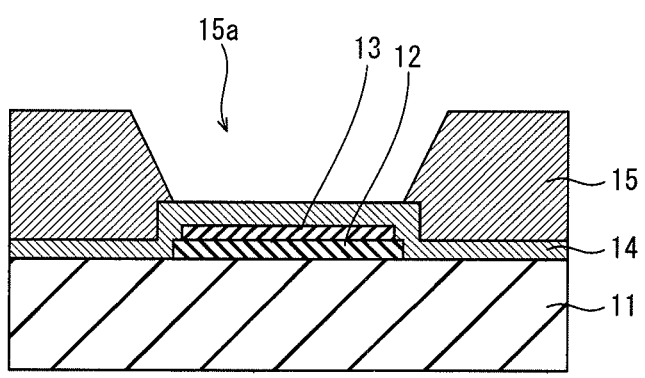

Next, as illustrated in FIG. 3C, the banks 15 are formed. As the bank material, for example, a photosensitive resist material, preferably a photoresist material containing a fluorine-based material, is prepared. The bank material is uniformly applied to the surface of the hole injection layer 14. The applied bank material is pre-baked, and then a mask with a pattern for forming the openings 15a is overlaid thereon. Subsequently, the hole injection layer 14 with the mask thereon is exposed to light, then unhardened portions of the bank material are washed away by developer. The resultant is cleaned with pure water and the banks 15 are completed.

Note that hole transport layers may be formed as necessary after the procedure for forming the banks 15 and before the procedure for forming the organic light-emitting layers 16. The hole transport layers may be formed, for example, by the solution-deposition-type film forming method similar to the organic light-emitting layers 16 which are described below.

Figure 4:
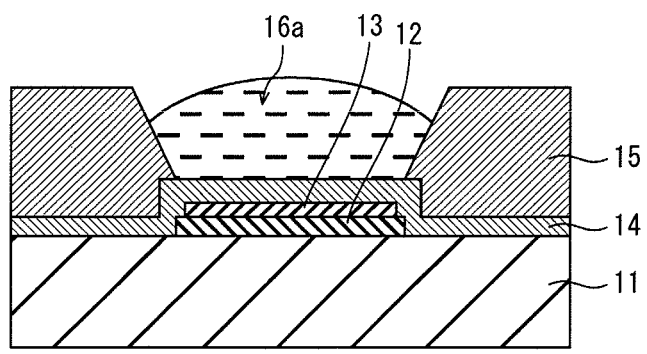
FIG. 4 (a)-(c) is a diagram illustrating an example of the manufacturing process of the organic EL display panel of the embodiment.
Figure 4:
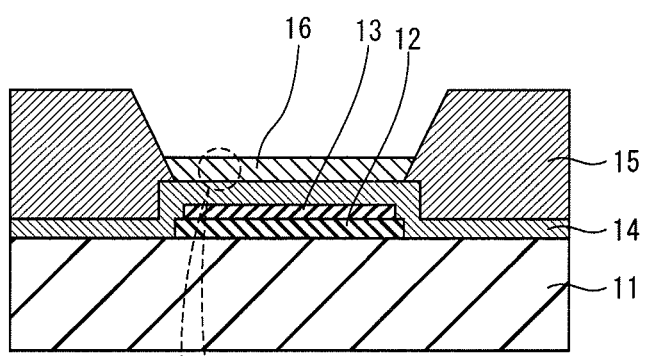
Figure 4:
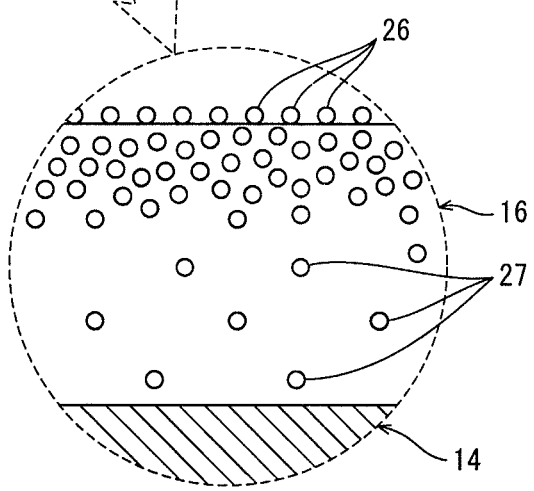

Subsequently, as illustrated in FIG. 4, portion (a), an organic light-emitting layer material, which contains a solvent and a material constituting the organic light-emitting layer, is applied into the openings 15a (FIG. 3C) demarcated by the banks 15. This completes the preparation of the substrate 11 with an organic light-emitting layer material applied film 16a formed thereon. Note that the method for applying the organic light-emitting coating layer material is not limited to the ink jet method, but may be, for example, the gravure printing method, dispenser method, nozzle coat method, intaglio printing, letterpress printing or the like.

Note that the "substrate with the organic light-emitting layer material applied film formed thereon" includes not only a substrate where the organic light-emitting layer material is applied directly on the substrate, but also a substrate where the organic light-emitting layer material is applied indirectly above the substrate. That is to say, another layer may be provided between the substrate and the organic light-emitting layer material applied film 16a. In the case of the substrate prepared in the preparation procedure of the present embodiment, the ITO layer 13 and the hole injection layer 14 are provided between the substrate 11 and the organic light-emitting layer material applied film 16a.

In the preparation procedure, a vacuum pump and a vacuum chamber connected to the vacuum pump are prepared as well, wherein the vacuum pump and the vacuum chamber are used in the next procedure illustrated in FIG. 4, portion (b). The vacuum pump may be, for example, a mechanical vacuum pump, such as a mechanical booster pump, a rotary pump or a diaphragm pump. Among these, particularly a dry pump, which does not use pump oil, is preferable for use. The dry pump may be used when the inside of the vacuum chamber needs to be kept clean, which is, for example, the case where a semiconductor thin film is manufactured. Furthermore, in the present embodiment, a vacuum sealing material and a lubricant, which contain an antioxidant that is mainly composed of diphenylamine, are used in a portion of the vacuum pump that is connected to the inside of the vacuum chamber.

<Drying Procedure>

In the drying procedure as a pressure reduction procedure illustrated in FIG. 4, portion (b), the substrate 11 with the organic light-emitting layer material applied film 16a formed thereon is laid in a vacuum chamber that is connected to a vacuum pump, and the internal pressure of the vacuum chamber is reduced by the vacuum pump. In the drying procedure, the internal pressure of the vacuum chamber is reduced to, for example, approximately 1 Pa or less.

With this drying procedure, the organic light-emitting layer material applied film 16a formed above the substrate 11 is dried. The applied film 16a is dried under a reduced pressure and turns into the organic light-emitting layer 16 (FIG. 4, portion (b)).

<Purification Procedure>

The purification procedure is performed in addition to a conventional manufacturing method of an organic EL element, based on the knowledge of the inventors that was obtained through intense study. Details of the knowledge obtained are described below in "Various experiments and consideration". The inventors found out that, as indicated by an enlargement of the organic light-emitting layer 16 and peripheral regions thereof illustrated in FIG. 4, portion (c), substances 26 and 27 existed on the surface and inside of the organic light-emitting layer 16 that had passed through the drying procedure (FIG. 4, portion (b)). In the following, the substances 26 that adhered to the surface of the organic light-emitting layer 16 are merely referred to as "adhered substances 26", and the substances 27 that were absorbed into the organic light-emitting layer 16 are merely referred to as "absorbed substances 27". The inventors further detected that the adhered substances 26 and absorbed substances 27 are diphenylamine that is used in a portion of the vacuum pump that is connected to the inside of the vacuum chamber. The adhered substances 26 and absorbed substances 27 flew from the vacuum pump into the vacuum chamber during the pressure reduction procedure.

Here, regarding the object to which the substances 26 adhere, two cases are considered: (1) the substances 26 adhere to the organic light-emitting layer 16 which the organic light-emitting layer material applied film 16a has turned into by passing through the drying procedure; and (2) the substances 26 adhere to the organic light-emitting layer material applied film 16a that is in the middle of the drying. Similarly, with regard to the object into which the substances 27 are absorbed, these two cases are considered as well. In the following description of the present embodiment, it is assumed that the substances are adhered to and absorbed into the organic light-emitting layer 16 which the organic light-emitting layer material applied film 16a has turned into by passing through the drying procedure.

Figure 5:
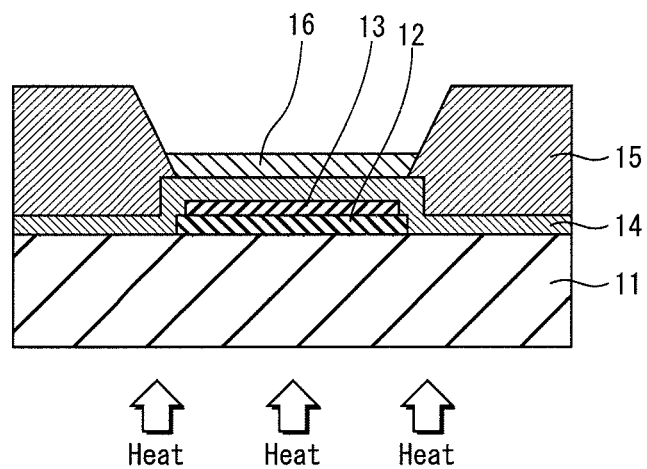
FIG. 5 (a)-(c) is a diagram illustrating an example of the manufacturing process of the organic EL display panel of the embodiment.
Figure 5:
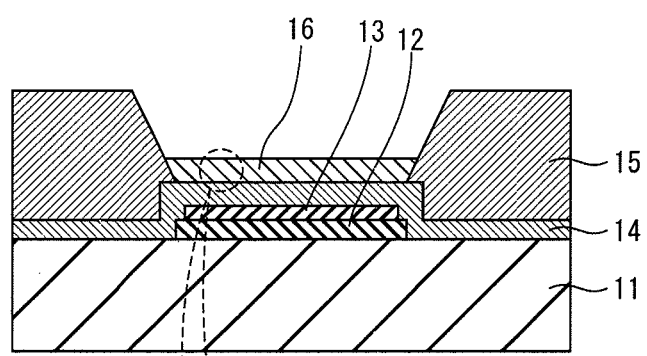
Figure 5:
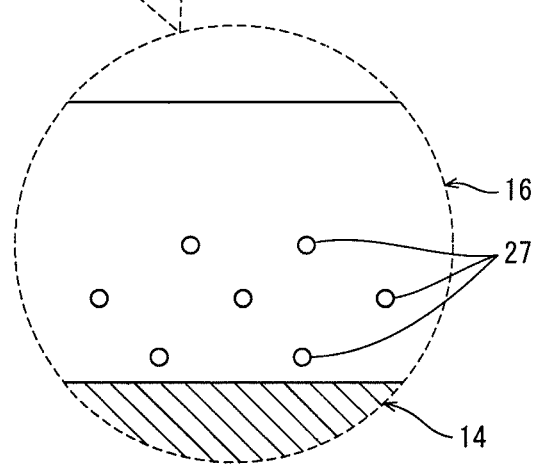

In the purification procedure, the substrate 11 having passed through the pressure reduction procedure is taken out from the vacuum chamber, and the organic light-emitting layer 16 which the organic light-emitting layer material applied film 16a has turned into by passing through the drying under the reduced pressure, is purified as illustrated in FIG. 5, portion (a). As illustrated in FIG. 5, portions (b) and (c), after the purification procedure, approximately all the adhered substances 26 have been evaporated and removed. Also, among the absorbed substances 27 in the organic light-emitting layer 16, some substances located near the surface of the organic light-emitting layer 16 have been evaporated and removed as well. Note that the purification procedure may be performed in the vacuum chamber. In that case, it is desirable that the purification procedure is performed in the state where the internal pressure of the vacuum chamber is the same as the atmospheric pressure, or in the state where the $N_2$ purge is being performed. Furthermore, if the inside of the vacuum chamber is in inert gas atmosphere, there is no need to reduce the internal pressure of the vacuum chamber.

As described above, the purification procedure of the present embodiment can remove substances that adhered to the surface and near-surface region of the organic light-emitting layer 16, more specifically, the removed substances are diphenylamine that is used in a portion of the vacuum pump that is connected to the inside of the vacuum chamber. It is thus possible to suppress at least the performance deterioration of the organic light-emitting layer 16 that is apt to occur due to adherence of diphenylamine. This also prevents another layer (in the present embodiment, the electron transport layer) from being laminated on the upper surface of the organic light-emitting layer 16 to which diphenylamine has adhered.

Here, it is considered that, even if the organic light-emitting layer 16 is left with the substances 26 adhered to its surface, only a small adverse effect is given thereto as far as electricity is not provided. The reason for this is considered that the substances 26 are merely physically adhering to the surface of the organic light-emitting layer 16, but no reaction has occurred between the material of the organic light-emitting layer 16 and the adhered substances 26, etc.

As one example of the purification method for use in the purification procedure, the applied film that has passed through the pressure reduction procedure may be heated so as to be purified. As another example of the purification method, the upper surface of the organic light-emitting layer 16 may be purged with an inert gas, such as nitrogen, or dry air, and the substrate 11 may be preserved in the vacuum chamber under vacuum by setting the target vacuum level to at least 15 Pa. As a further example of the purification method, the substrate 11 may be cleaned with IPA (isopropyl alcohol) or the like.

In the purification procedure, for example, the substrate 11 after the pressure reduction procedure may be heated so that the organic light-emitting layer 16 has a diphenylamine content in a range from more than 0 nmol/cm$^3$ to 13.8 nmol/cm$^3$. It should be noted here that diphenylamine can be used as a material of the above-described hole transport layer. With such diphenylamine content, it is possible to cause diphenylamine to function as a hole transporting material that assists with transportation of holes. The inventors made an intense study on the heating condition for realizing such diphenylamine content, as described in detail below. As a result, it was found that, in an x-y orthogonal coordinate system with its x axis representing the heating temperature (° C.) and its y axis representing the heating time (min), a combination of the heating temperature and the heating time of the purification procedure may be selected from among pairs of x coordinate value and y coordinate value that belong to the region above a curve represented by a quadratic function $y=0.0146x^2-5.5x+528.54$ in the x-y orthogonal coordinate system, the region including the curve.

<Electron Transport Layer Forming Procedure to Sealing Layer Forming Procedure>

Figure 6A:
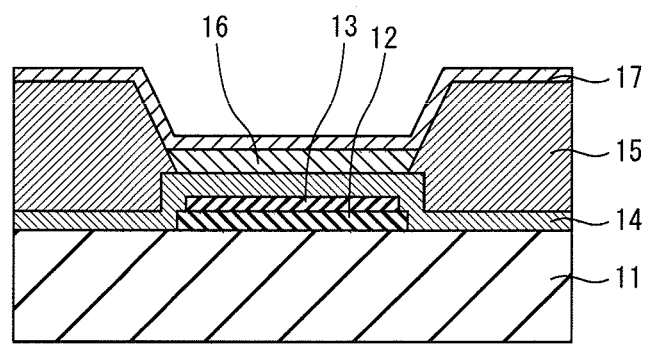

After the purification procedure is completed, the electron transport layer 17 is formed on the organic light-emitting layer 16, as illustrated in FIG. 6A. More specifically, the electron transport layer 17 is formed by forming a film made of a material constituting the electron transport layer 17 on the upper surface of the organic light-emitting layer 16 by the vacuum film-forming method such as the vacuum deposition method, sputtering method or the like.

Here, the vapor pressure of the electron transport layer material occupies a very high ratio of the internal pressure of the film-forming vessel, and the vapor pressure of the impurities in the film-forming vessel is approximately 0%. Accordingly, even if the material used in the vacuum pump provided in the vacuum film-forming apparatus flies into the film-forming vessel, there is no fear that the material adheres to the surface of the organic light-emitting layer 16 or is absorbed into the organic light-emitting layer 16. Furthermore, in the vacuum film-forming procedure, it is desirable to use a non-mechanical pump such as a cryopump, not to use a mechanical pump. This makes it possible, from the start, to prevent a material used in the vacuum pump from flying into the film-forming vessel.

Note that an electron injection layer may be formed as necessary after the procedure of forming the electron transport layer 17 and before the procedure of forming the cathode 18. The electron injection layer can be formed by, for example, forming a film made of a material having electron-injection properties by the vacuum film-forming method such as the vacuum deposition method, sputtering method or the like.

Figure 6B:
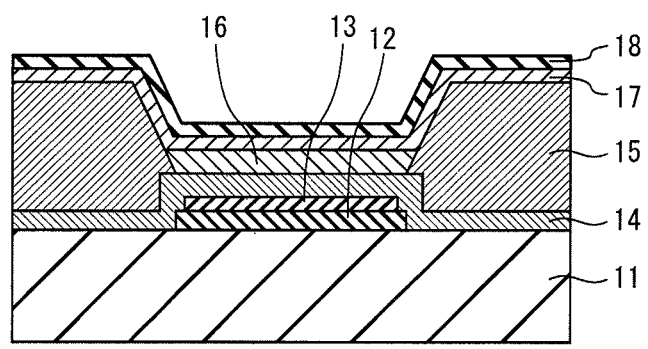

Subsequently, the cathode 18 is formed on the electron transport layer 17, as illustrated in FIG. 6B. More specifically, the cathode 18 is formed by forming a film of ITO, IZO or the like by the vacuum film-forming method such as the vacuum deposition method, sputtering method or the like.

After the cathode forming procedure is completed, the sealing layer 19 is formed on the cathode 18 by the vacuum deposition method, sputtering method or the like, as illustrated in FIG. 6C. Subsequently, the sealing substrate is placed above and opposite the sealing layer 19, and, as necessary, a space formed between the sealing layer 19 and the sealing substrate is filled with an insulative material.

The organic EL device display panel 10 is completed through the above-described procedures.

[Various Experiments and Consideration]

<Difference in Light-Emitting Characteristics by Presence/Absence of Pressure Reduction Procedure>

The inventors verified whether or not performing the pressure reduction procedure after the application of the organic light-emitting layer material makes any difference to the light-emitting characteristics of the organic EL element. As the samples for the experiment, two types of organic EL elements were prepared: an organic EL element in which the pressure reduction procedure had not been performed (hereinafter referred to as "organic EL element without the pressure reduction procedure"); and an organic EL element in which the pressure reduction procedure had been performed (hereinafter referred to as "organic EL element with the pressure reduction procedure").

The organic EL element without the pressure reduction procedure was formed as follows. First, according to the above-described manufacturing method, anodes, a hole injection layer and a hole transport layer were laminated in the stated order on a substrate. Next, an organic light-emitting layer material was applied on the upper surface of the hole transport layer, and a film of an organic light-emitting layer was formed by heating and drying the organic light-emitting layer material. Subsequently, the substrate on which the film of the organic light-emitting layer had been formed was laid in a glove box for 20 minutes. After this, the organic EL element without the pressure reduction procedure was completed by laminating an electron transport layer, a cathode and a sealing layer in the stated order on the organic light-emitting layer.

The organic EL element with the pressure reduction procedure was formed as follows. First, as is the case with the organic EL element without the pressure reduction procedure, anodes, a hole injection layer, a hole transport layer and an organic light-emitting layer were laminated in the stated order on a substrate. Next, the substrate on which the film of the organic light-emitting layer had been formed was laid in a vacuum chamber that was connected with a vacuum pump. Subsequently, the vacuum pump was activated to reduce the internal pressure of the vacuum chamber, and the substrate on which the film of the organic light-emitting layer had been formed was left in the chamber in this state for 20 minutes. After this, the organic EL element with the pressure reduction procedure was completed by laminating an electron transport layer, a cathode and a sealing layer in the stated order on the organic light-emitting layer. As the vacuum pump, a mechanical booster pump was used. Note that the above-described purification procedure was not performed on both the organic EL elements with and without the pressure reduction procedure.

Figure 7:
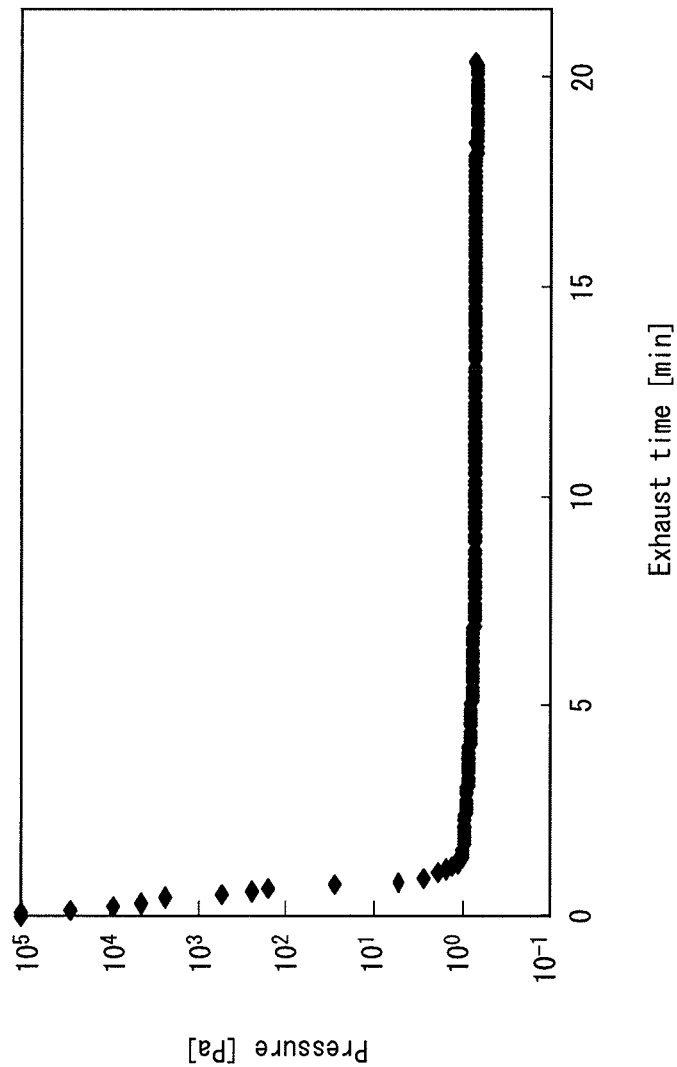
FIG. 7 is a graph indicating the relationship between the exhaust time by the mechanical booster pump used in the experiment and the internal pressure of the vacuum chamber.

FIG. 7 is a graph indicating the relationship between the exhaust time by the mechanical booster pump used in the experiment and the internal pressure of the vacuum chamber. The experiment was conducted by using a pump that has an exhaust profile as illustrated in FIG. 7. The horizontal axis represents the exhaust time by the vacuum pump, and the vertical axis represents the internal pressure of the vacuum chamber.

In both the organic EL elements without and with the pressure reduction procedure, known materials were used for the anodes, hole injection layer, hole transport layer, electron transport layer, cathode, and sealing layer. F8-F6 was used as the material of the organic light-emitting layer.

Note that, of course, when the organic EL element without the pressure reduction procedure is manufactured, the pressure reduction procedure for drying the organic light-emitting layer material cannot be performed. As a result, xylene, which is a low boiling point solvent for which drying by the pressure reduction procedure is not necessary, was used as a solvent for solving the material constituting the organic light-emitting layer. However, when xylene is used as the solvent, application by the ink jet method is not available. That is to say, xylene was used merely in the experiment. For this reason, when manufacturing the organic EL element for the experiment, the organic light-emitting layer material was dried by heating. Furthermore, for comparison between the organic EL elements of the experiment, the drying by heating was also performed on the organic EL element with the pressure reduction procedure.

Figure 8:
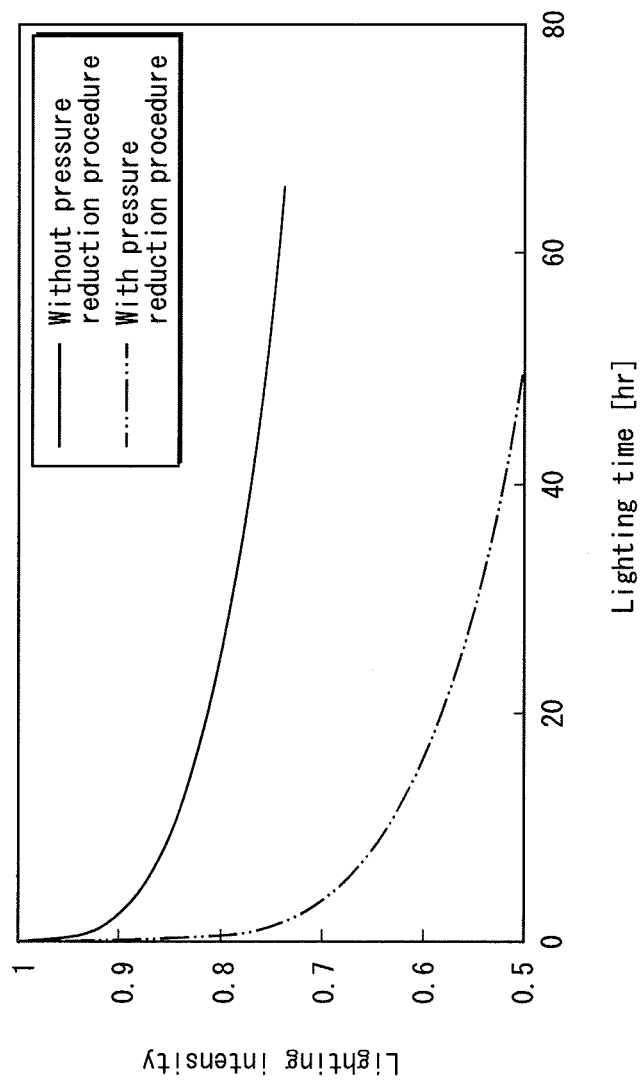
FIG. 8 is a diagram illustrating the light-emitting characteristics of the organic EL elements without and with the pressure reduction procedure.

FIG. 8 is a diagram illustrating the light-emitting characteristics of the organic EL elements without and with the pressure reduction procedure. FIG. 8 is a graph indicating the relationship between the lighting time and the lighting intensity in the lighting of the organic EL elements of the experiment, the horizontal axis representing the lighting time (hours), and the vertical axis representing the lighting intensity. The lighting intensity is represented by a proportional value, with the lighting intensity immediately after a lighting start being set as 1. In FIG. 8, the solid line represents the light-emitting characteristics of the organic EL element without the pressure reduction procedure ("Without pressure reduction procedure" in FIG. 8), and the two-dot chain line represents the light-emitting characteristics of the organic EL element with the pressure reduction procedure ("With pressure reduction procedure" in FIG. 8).

It is understood that, compared with the organic EL element without the pressure reduction procedure, the organic EL element with the pressure reduction procedure greatly reduces the lighting intensity with time. In other words, the organic EL element with the pressure reduction procedure after the application of the organic light-emitting layer material has a shorter life until the lighting intensity reduces to half (the time required for the lighting intensity to reduce to half), than the organic EL element without the pressure reduction procedure.

The two organic EL elements of the experiment differ only in the environment in which the substrate is placed after the formation of the organic light-emitting layer. That is to say, the great difference in the life until the lighting intensity reduces to half was created due to whether the substrate is laid in the glove box or in the vacuum chamber which is connected with a vacuum pump. The inventors, from the results illustrated in FIG. 8, considered that the organic light-emitting layer might have been negatively affected by materials that were used in a portion of the vacuum pump that is connected to the inside of the vacuum chamber.

As the materials that may be used in the portion of the vacuum pump that is connected to the inside of the vacuum chamber, the following, for example, are considered: (i) a lubricant used in a drive unit of the vacuum pump; and (ii) a vacuum sealing material that is used in a connector connecting the vacuum pump with the vacuum chamber, and used in the portion of the vacuum pump that is connected to the inside of the vacuum chamber. The lubricant contains a lubricating component and an antioxidant for preventing the lubricating component from oxidizing. The vacuum sealing material contains a resin material and an antioxidant for preventing the resin material from oxidizing. Note that the concept of the resin material contained in the vacuum sealing material includes rubber. Diphenylamine can be used both as the antioxidant for preventing the lubricating component from oxidizing and as the antioxidant for preventing the resin material from oxidizing. Hereinafter, the "materials that are used in a portion of the vacuum pump that is connected to the inside of the vacuum chamber" is merely referred to as the "vacuum-pump-derived materials". Also, the lubricant and the vacuum sealing material are collectively referred to as the "lubricant and the like".

In the organic EL element with the pressure reduction procedure for the experiment, the electron transport layer had been formed by the vacuum film-forming method. Judging from the fact that the light-emitting characteristics were negatively affected even after the vacuum film-forming procedure, the materials negatively affecting the organic light-emitting layer were assumed to have a relatively high boiling point and not to evaporate even under a high level of vacuum during the vacuum film forming. Therefore, the inventors considered that the vacuum-pump-derived materials, such as the lubricant and the like, might have turned into the adhered substances 26 and negatively affected the organic light-emitting layer.

Antioxidants are used to prevent so-called sludge and varnish from being generated due to the oxidation of the lubricating component or resin material. Known types of antioxidants include, for example, a chain stopping agent, a peroxide-decomposing agent, and a metal inactivating agent. Among these, the inventors paid attention to the chain stopping agent that is composed of a diphenylamine-based compound, which is represented by diphenylamine, and stops the progress of oxidation of the lubricating component and the resin material. In general, radicals are unstable. However, in the case of a radical that is formed when a diphenylamine-based compound loses a hydrogen atom, the radical is considered to be relatively stable because a resonance stabilization occurs due to an aromatic ring adjacent to the radical portion. For this reason, such compounds react to be radicals themselves by supplying hydrogen atoms to the radical species and the highly reactive peroxides that are generated by oxidation. Although radicals of the diphenylamine-based compounds are relatively stable, they have reactivity to the extent that they react with the peroxides that are generated by oxidation. The radicals of the diphenylamine-based compounds have a property to stop the oxidation reaction by reacting with the peroxides, and for this property, are used as the chain stopping agent that stops the progress of oxidation.

<Mechanism by which Time Until Lighting Intensity Reduces to Half is Shortened>

Figure 9:
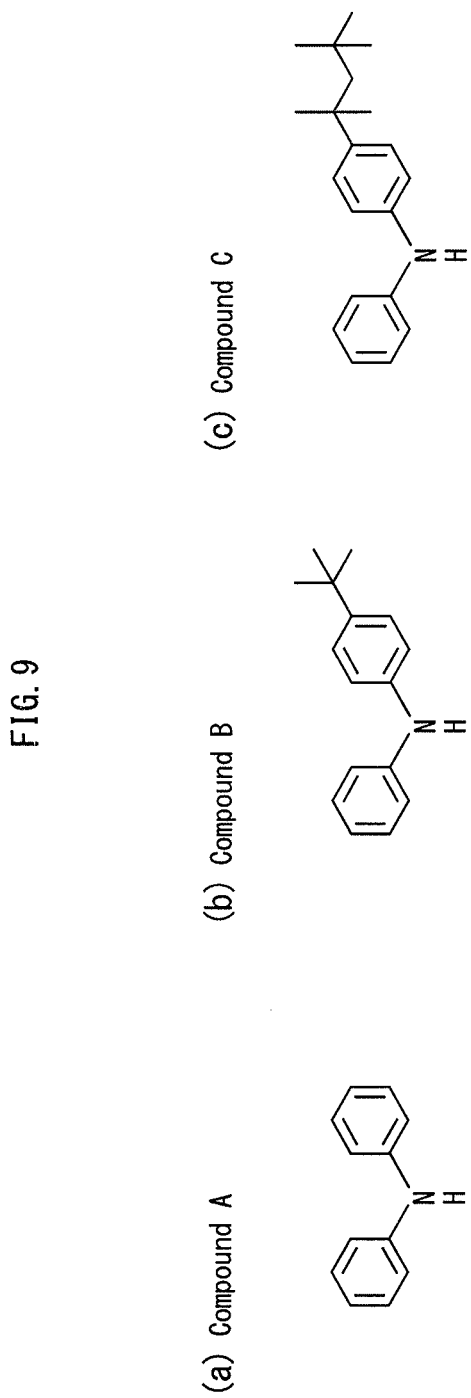
FIG. 9 (a)-(c) is a diagram illustrating examples of diphenylamine-based compounds used as antioxidants.

FIG. 9 is a diagram illustrating examples of diphenylamine-based compounds used as antioxidants. Portions (a), (b) and (c) of FIG. 9 illustrate respective chemical formulas of compounds A, B and C as examples of diphenylamine-based compounds. Note that compound A is diphenylamine.

Figure 10:
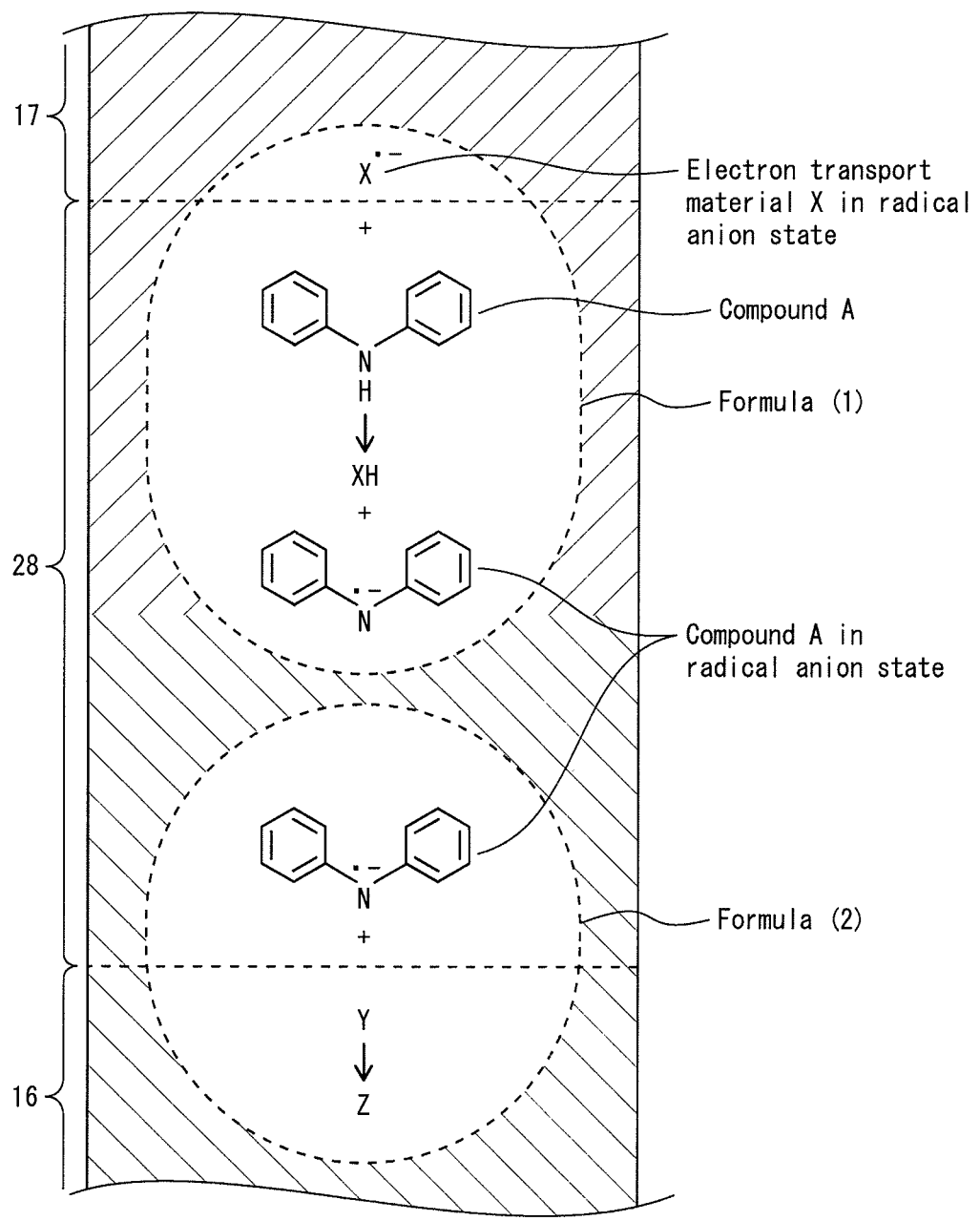
FIG. 10 is a diagram for explaining one example of the mechanism by which the time until the lighting intensity reduces to half is shortened due to the diphenylamine-based compound.

FIG. 10 is a diagram for explaining one example of the mechanism by which the time until the lighting intensity reduces to half is shortened due to the diphenylamine-based compound. FIG. 10 illustrates the mechanism where the life is affected by compound A, but the mechanism can be explained similarly with regard to compound B and C, as well. In the drawing, an interface region 28 between the organic light-emitting layer 16 and the electron transport layer 17 is illustrated by exaggeration for the sake of explanation.

First, as indicated by formula (1), when the organic EL element is being driven, an electron transport material X constituting the electron transport layer 17 is in the radical anion (polaron) state ("Electron transport material X in radical anion state" in FIG. 10) for electrons to be transported. Therefore the electron transport material X in the radical anion state can be considered as a carrier. In the interface region 28, compound A supplies hydrogen atoms to the electron transport material X in the radical anion state so as to be in the radical anion state itself ("Compound A in radical anion state" in FIG. 10). The inventors considered that the reason for such reaction to occur is that compound A in the radical anion state can exist in a stable manner due to the delocalization of the negative charges in the two benzene rings. That is to say, the inventors considered that the compound A in the radical anion state has a more stable structure than the electron transport material X in the radical anion state. In that case, a reaction where the electron transport material X in the radical anion state bonds with hydrogen atoms emitted from the compound A may occur as well ("XH" in FIG. 10).

As can be explained based on formula (1), it is considered that one of the factors for the organic EL element with the pressure reduction procedure to greatly reduce the lighting intensity is that the electron transport material X in the radical anion state, which is the carrier, is eliminated by the compound A, thereby the amount of electron injected into the organic light-emitting layer 16 is reduced.

Next, as indicated by formula (2), it is assumed that, in the interface region 28, the compound A in the radical anion state may react with the material Y that constitutes the organic light-emitting layer 16. This reaction produces a product Z that is different from the material Y that constitutes the organic light-emitting layer 16. This corresponds to the deterioration of the organic light-emitting layer 16. It is considered that such a reaction between the compound A and the material Y that constitutes the organic light-emitting layer 16 is also one of the factors for the light-emitting intensity to be reduced. However, the material with which the compound A reacts with is not limited to the material Y, but may be, for example, a slight amount of water contained in the organic light-emitting layer 16, or a residual solvent that derives from the solvent contained in the organic light-emitting layer material.

Since the above-described mechanism is assumed, the inventors considered that the antioxidant contained in the lubricant and the like, in particular the chain stopping agent, has a great influence on the shortage of the time until the lighting intensity reduces to half.

FIG. 10 illustrates a mechanism that may occur when the compound A exists in the interface between the organic light-emitting layer 16 and the electron transport layer 17. That is to say, the mechanism may occur when the compound A is the adhered substances 26. However, the mechanism of FIG. 10 does not occur when the compound A is the absorbed substances 27. That is to say, when the compound A adheres to the surface of the organic light-emitting layer 16 as the adhered substances 26, the compound A may function as impurities that deteriorate the performance of the organic light-emitting layer 16, and when the compound A is absorbed into the organic light-emitting layer 16 as the absorbed substances 27, the compound A may function as the above-described hole transport material.

<Analysis of Surface of Organic Light-Emitting Layer Having Passed Through Pressure Reduction Procedure>

Next, materials that have adhered to the surface of the organic light-emitting layer that had passed through the pressure reduction procedure were analyzed by using a gas chromatograph mass spectrometer (GC-MS). The organic light-emitting layer having passed through the pressure reduction procedure was heated in a helium atmosphere, and the gas (outgas) from the heated organic light-emitting layer was collected by liquid nitrogen, and the collected gas was analyzed by the GC-MS. For the GC-MS analysis, 6890GC made by Agilent Technologies Inc. was used, and the ionization was performed by the EI (Electron Ionization) method. For the column, DB-5 mn made by Agilent Technologies Inc. was used, and heating was performed to increase the temperature from 40° C. to 300° C.

Figure 11:
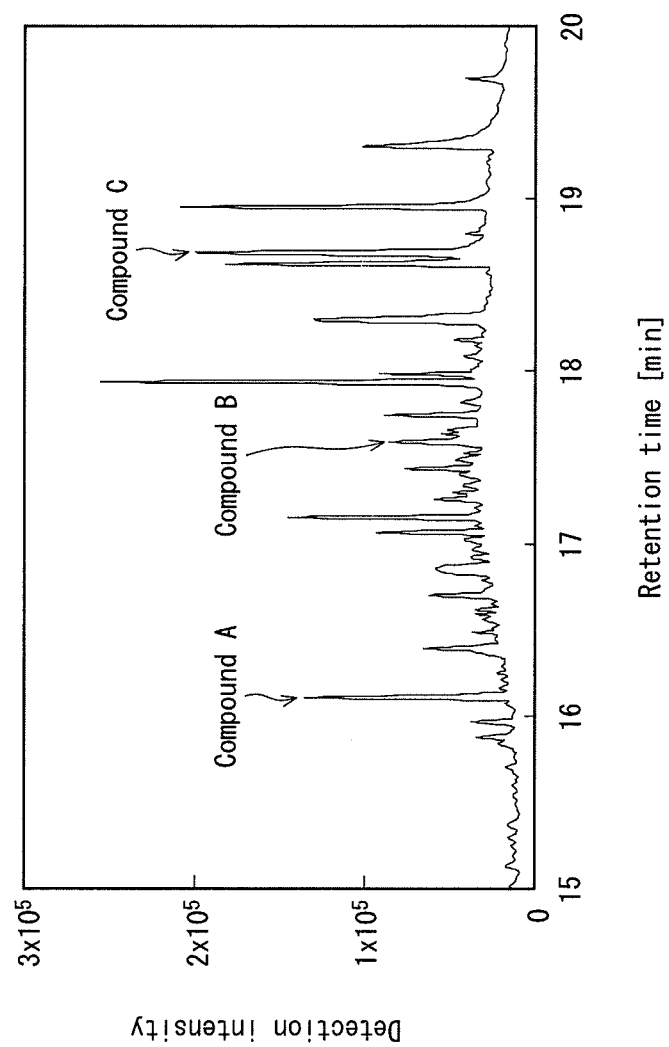
FIG. 11 is a diagram illustrating the results of the analysis of the adsorption materials on the organic light-emitting layer having passed through the pressure reduction procedure.

FIG. 11 is a diagram illustrating the results of the analysis of the surface of the organic light-emitting layer having passed through the pressure reduction procedure. The vertical axis represents the detection intensity (that is the "total ion current" and corresponds to the number of detected molecules), and the horizontal axis represents the retention time (minutes). FIG. 11 illustrates a gas chromatograph for a range between 15 minutes and 20 minutes of retention time. Peaks of the compounds A, B and C were detected at approximately 16 minutes to 19 minutes of retention time. The GC-MS analysis was also conducted on pure products of the compounds A, B and C and it was confirmed that the retention times and mass spectra thereof match the results illustrated in FIG. 11.

From the results of the GC-MS analysis, the inventors found out that the diphenylamine-based compounds that are contained, as antioxidants, in the lubricant and the like used in the vacuum pump are the adhered substances 26 that cause the shortage of the time until the lighting intensity reduces to half.

The inventors further assumed that the diphenylamine-based compounds may fly from the vacuum pump into the vacuum chamber by the mechanism explained in the next section.

Note that the inventors found out that the diphenylamine-based compounds tend to adhere to an organic film housed in the vacuum chamber, wherein a representative of the organic film is the organic light-emitting layer. The following explains this.

First, the inventors connected the mechanical booster pump to the vacuum chamber, collected gas from the inside of the vacuum chamber when the internal pressure of the vacuum chamber is the atmospheric pressure, and analyzed the collected gas by the GC-MS. In this analysis, the inventors failed to detect a diphenylamine-based compound. The inventors attributed this to not having reduced the internal pressure of the vacuum chamber. Thus, following this, the inventors placed a glass substrate and a silicon wafer in the vacuum chamber, reduced the internal pressure of the vacuum chamber by using the mechanical booster pump, and collected gas from the inside of the vacuum chamber. In this case too, however, the inventors failed to detect a diphenylamine-based compound.

Upon reviewing these results, the inventors considered that the diphenylamine-based compounds may adhere to an organic film such as the organic light-emitting layer. Therefore, the inventors placed a substrate on which an organic light-emitting layer material had been applied in the vacuum chamber, reduced the internal pressure of the vacuum chamber by using the mechanical booster pump, collected gas from the inside of the vacuum chamber, and analyzed the collected gas by the above-described GC-MS method. In this analysis, the inventors could detect peaks of the diphenylamine-based compounds, as indicated in the spectra illustrated in FIG. 11.

As described up to now, a diphenylamine-based compound could not be detected when the pressure reduction procedure was performed onto a glass substrate or the like. From this, it can be said that diphenylamine-based compounds adhere to an organic film having passed through the pressure reduction procedure, but do not adhere to an inorganic material having passed through the pressure reduction procedure. That is to say, components of the lubricant and the like used in the vacuum pump adhere only to organic films. From these, it can be said that the adherence of components of the lubricant and the like is characteristic to organic films.

<Mechanism for Diphenylamine-Based Compounds to Fly from Vacuum Pump into Vacuum Chamber>

Figure 12:
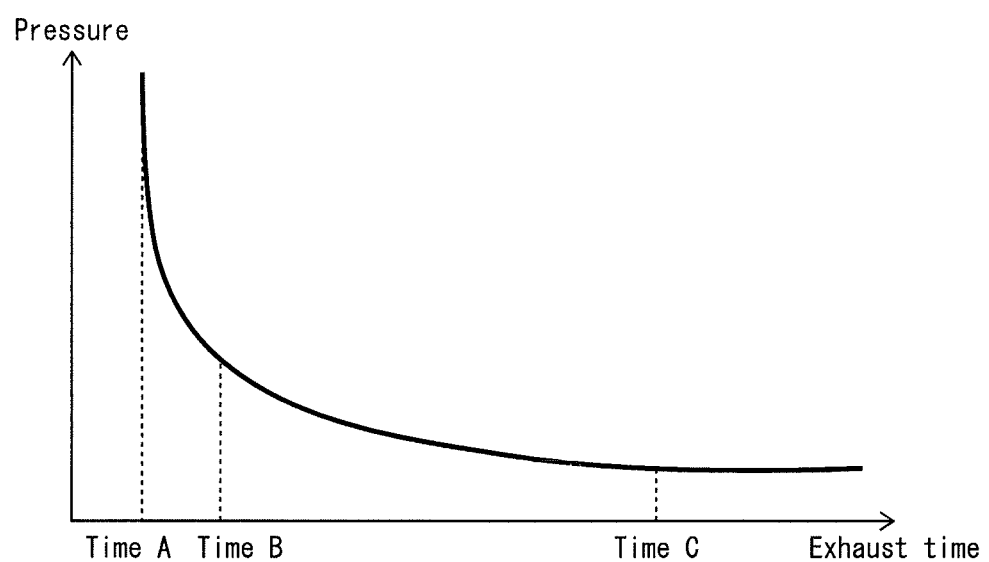
FIG. 12 is a graph illustrating the relationship between the exhaust time by the vacuum pump and the internal pressure of the vacuum chamber.

FIG. 12 is a graph illustrating the relationship between the exhaust time by the vacuum pump and the internal pressure of the vacuum chamber. The horizontal axis represents the exhaust time and the vertical axis represents the internal pressure of the vacuum chamber. Note that in the vertical axis, a lower position indicates a higher level of vacuum.

The time A corresponds to the time at which the vacuum pump is activated. The time B corresponds to the time at which the reduction of the internal pressure of the vacuum chamber is in progress. At time C, the internal pressure of the vacuum chamber has been reduced to the limit of performance of the vacuum pump and has reached the equilibrium state. The following explains the situations inside the vacuum chamber and the vacuum pump at times A, B and C with reference to FIGS. 13A, 13B and 13C.

Figure 13A:
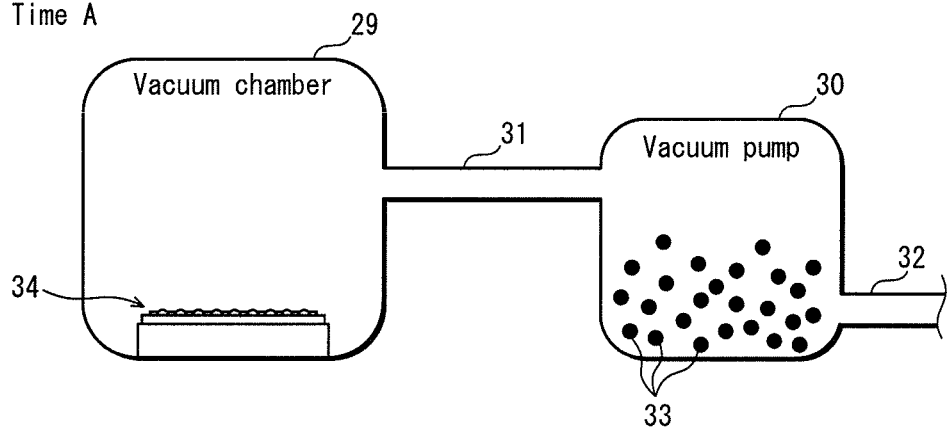
FIGS. 13A, 13B and 13C are diagrams schematically illustrating the situations inside the vacuum chamber and the vacuum pump at times A, B and C indicated in the graph of FIG. 12, respectively.
Figure 13B:
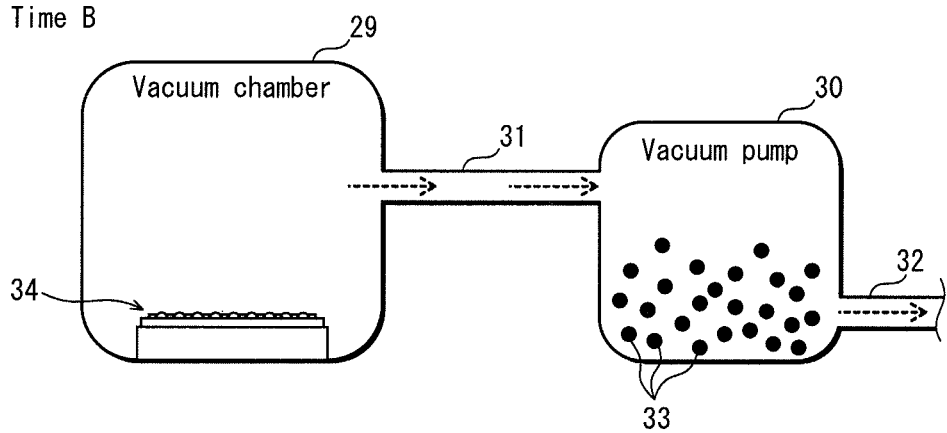
Figure 13C:
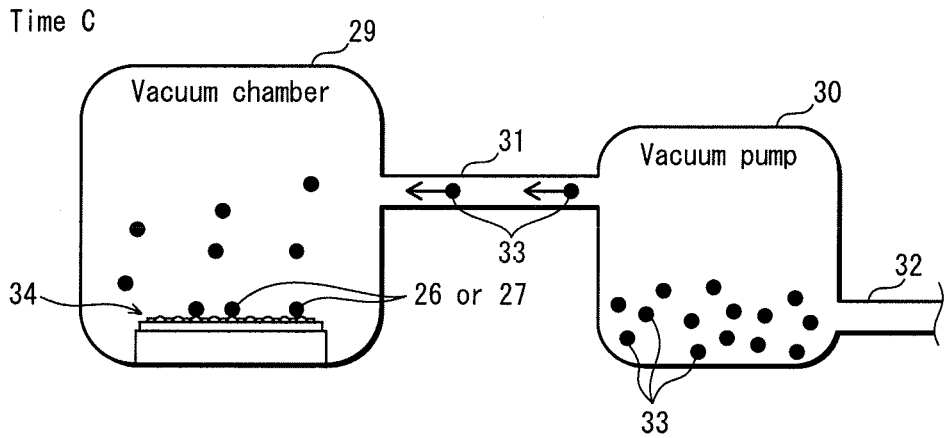

FIGS. 13A, 13B and 13C are diagrams schematically illustrating the situations inside the vacuum chamber and the vacuum pump at times A, B and C indicated in the graph of FIG. 12, respectively.

As illustrated in FIGS. 13A to 13C, the vacuum chamber 29 is connected to the vacuum pump via the exhaust pipe 31.

The gas in the vacuum chamber 29 is discharged to outside by the vacuum pump 30 via the exhaust pipes 31 and 32. Also, in the drawings, vacuum-pump-derived materials are indicated by the reference sign "33".

FIG. 13A illustrates the situation at the time of the activation of the vacuum pump 30. When the pressure reduction is started, as indicated by the dotted-line arrow in FIG. 13B, the gas in the vacuum chamber 29 flows through the exhaust pipe 31, the vacuum pump 30 and the exhaust pipe 32, and is then discharged to outside. In this way, an air flow, which flows from the vacuum chamber 29 to the exhaust pipe 31, to the vacuum pump 30 and then to the exhaust pipe 32, is generated. For this reason, it is considered that no vacuum-pump-derived materials 33 fly into the vacuum chamber 29 during the pressure reducing period (at time B).

However, at time C, the internal pressure of the vacuum chamber 29 has been reduced to the limit of performance of the vacuum pump 30. Thus the air flow between the vacuum chamber 29 and the vacuum pump 30 is in the equilibrium state. Furthermore, the higher the level of vacuum in the vacuum chamber 29 and the vacuum pump 30 is, the longer the mean free path of the vacuum-pump-derived materials 33 is. From these, the inventors considered that, as illustrated in FIG. 13C, the vacuum-pump-derived materials 33 fly from the vacuum pump 30 into the vacuum chamber 29, and the vacuum-pump-derived materials 33 adhere to, or are absorbed into, the organic light-emitting layer material applied film formed on the substrate 34, namely as the adhered substances 26 and the absorbed substances 27. Meanwhile, with the increase of the level of vacuum in the vacuum chamber 29 and the vacuum pump 30, the percentage of the vapor pressure of the vacuum-pump-derived materials 33 in the pressures in the vacuum chamber 29 and the vacuum pump 30 increases. This also promotes flying of the vacuum-pump-derived materials 33. Furthermore, in the state where the vacuum-pump-derived materials 33 are flying into the vacuum chamber 29, the higher the level of vacuum in the vacuum chamber 29 and the vacuum pump 30 is, the longer the mean free path of the vacuum-pump-derived materials 33 is. This promotes the flying of the materials from the vacuum pump 30, thereby increasing the probability of collision of the vacuum-pump-derived materials 33 with the organic light-emitting layer material applied film.

<Details of Purification Procedure>

(Process by which Inventor Reached Concept of Purification Procedure)

As described above, when the compound A is the adhered substances 26, the compound A functions as impurities that deteriorate the light-emitting characteristics of the organic light-emitting layer 16. On the other hand, when the compound A is the absorbed substances 27, the compound A functions as a material that improves the light-emitting characteristics of the organic light-emitting layer 16. In view of these, the inventors had an idea of improving the light-emitting characteristics of the organic light-emitting layer 16 by removing the diphenylamine-based compounds as the adhered substances 26 from the surface of the organic light-emitting layer material applied film 16a (organic light-emitting layer 16) approximately completely, and of causing a slight amount of the diphenylamine-based compounds to remain in the film 16a (the layer 16) as the absorbed substances 27. The inventors considered that the purification procedure would be an appropriate method for realizing the above idea. This is because the inventors considered that if, for example, heating was performed with appropriately set heating temperature and heating time during the purification procedure, it would be possible to remove the adhered substances 26 approximately completely and cause a slight amount of the absorbed substances 27 to remain, with hardly any damage caused on the organic light-emitting layer 16.

(Effect of Diphenylamine-Based Compounds of Improving Light-Emitting Characteristics)

An experiment was conducted to make a comparison in light-emitting characteristics between an organic EL element that contains diphenylamine-based compounds in the organic light-emitting layer, and an organic EL element that does not contain diphenylamine-based compounds. In this experiment, the compound A was used as the diphenylamine-based compound, and the amount of the compound A per unit volume of the organic light-emitting layer was set to 5 nmol/cm$^3$.

First, an organic EL element that contains the compound A in the organic light-emitting layer, and an organic EL element that does not contain the compound A were prepared. The organic EL element that does not contain the compound A in the organic light-emitting layer was manufactured in the same procedures as the above-described organic EL element without the pressure reduction procedure for the experiment.

The organic EL element that contains the compound A in the organic light-emitting layer was manufactured as follows. First, as is the case with the above-described organic EL element with the pressure reduction procedure, anodes, a hole injection layer, a hole transport layer and an organic light-emitting layer were laminated in the stated order on a substrate. Subsequently, the substrate on which the film of the organic light-emitting layer had been formed was placed in the vacuum chamber, and then the vacuum pump was activated to reduce the internal pressure of the vacuum chamber, and the substrate was left in the chamber in this state for 20 minutes. As the vacuum pump, a mechanical booster pump was used. Also, the compound A was used in a portion of the mechanical booster pump that was connected to the inside of the vacuum chamber. Subsequently, the substrate was heated at a temperature of 170° C. for 15 minutes. After this, an electron transport layer, a cathode and a sealing layer were laminated in the stated order on the heated organic light-emitting layer.

Figure 14:
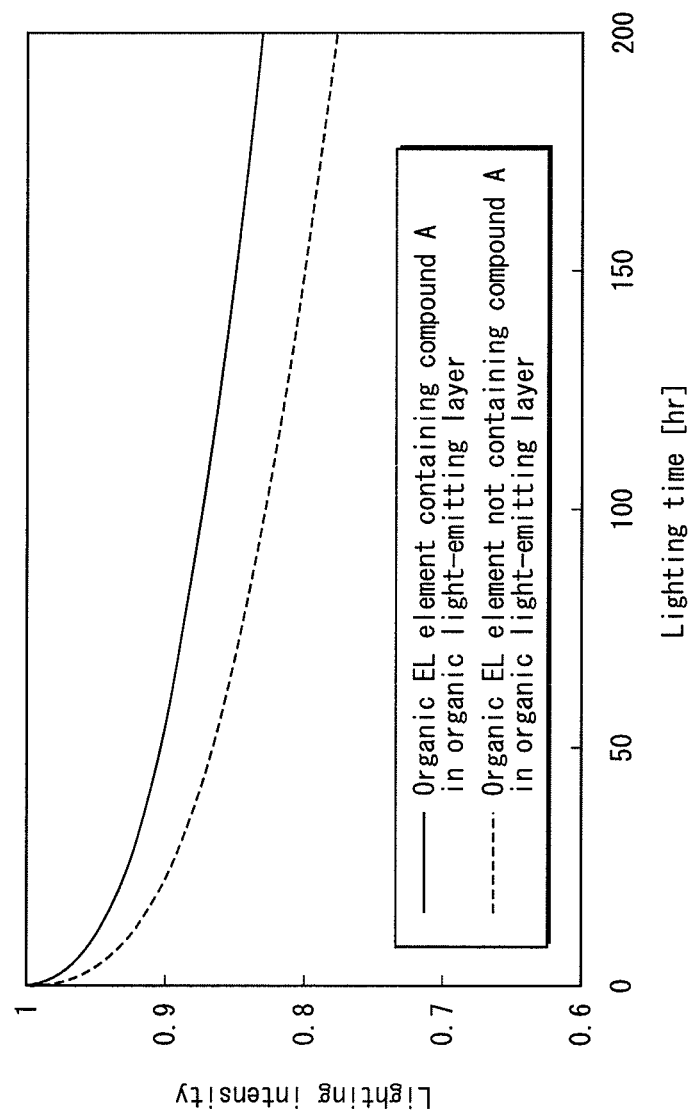
FIG. 14 is a diagram illustrating the light-emitting characteristics of the organic EL elements containing and not containing the compound A in the organic light-emitting layer.

FIG. 14 is a diagram illustrating the light-emitting characteristics of the organic EL elements containing and not containing the compound A in the organic light-emitting layer. The horizontal axis represents the lighting time (hours), and the vertical axis represents the lighting intensity. The lighting intensity is represented by a proportional value, with the lighting intensity immediately after a lighting start being set as 1. Also, the solid line represents the light-emitting characteristics of the organic EL element containing the compound A in the organic light-emitting layer, and the dotted line represents the light-emitting characteristics of the organic EL element that does not contain the compound A in the organic light-emitting layer.

FIG. 14 indicates that the time until the lighting intensity reduces to half of the organic EL element containing the compound A in the organic light-emitting layer is longer than that of the organic EL element that does not contain the compound A. The result of the experiment verifies that the compound A contained in the organic light-emitting layer improves the light-emitting characteristics.

Next, the inventors researched how much of the diphenylamine-based compounds needs to be contained in the organic light-emitting layer for the effect of improving the light-emitting characteristics to be produced. More specifically, the inventors tried to detect the amount of the diphenylamine-based compounds per unit volume of the organic light-emitting layer that is required for the effect of improving the light-emitting characteristics to be produced. It is considered that the amount of the diphenylamine-based compounds per unit volume of the organic light-emitting layer can be changed by changing the heating temperature and heating time. Thus the inventors also researched the heating temperature and the heating time that correspond to the amount required for the effect of improving the light-emitting characteristics to be produced.

(Behavior of Diphenylamine-Based Compounds when Absorbed into Organic Light-Emitting Layer)

To research the amount of the diphenylamine-based compound and the heating temperature and heating time for producing the effect of improving the light-emitting characteristics, a diphenylamine-based compound was selected. More specifically, a plurality of diphenylamine-based compounds were checked on their behavior when they were absorbed into the organic light-emitting layer. That is to say, the compounds A, B and C illustrated in FIG. 9 were checked on how easily they were absorbed into the organic light-emitting layer, and the most easily absorbed one was selected as the compound to be used in the following research. The behavior when absorbed into the organic light-emitting layer was analyzed by the GC-MS analysis.

Figure 15:
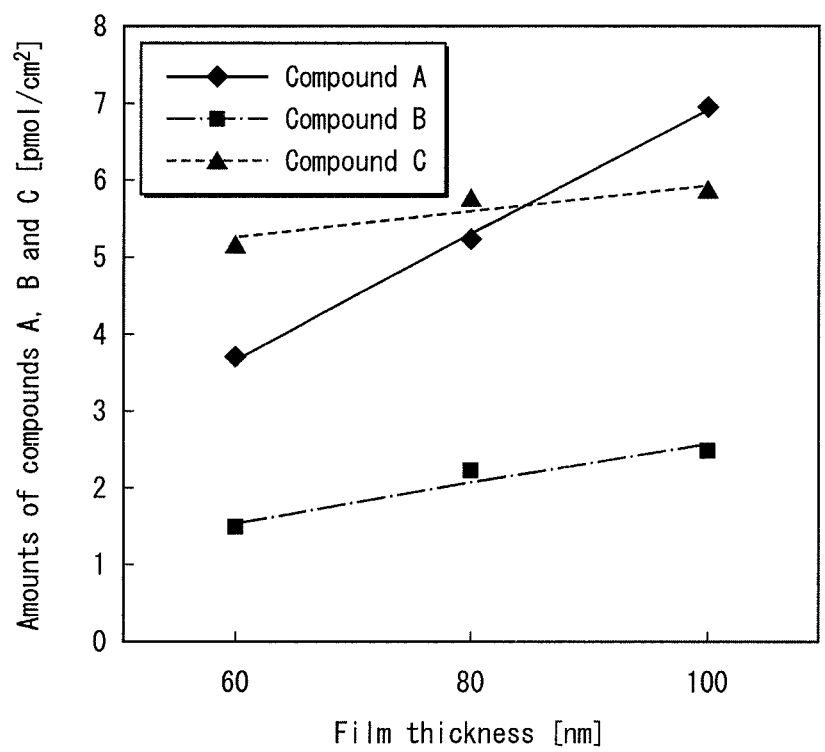
FIG. 15 is a graph indicating the behavior of the compounds A, B and C absorbed into the organic light-emitting layer illustrated in FIG. 9 when they were absorbed into the organic light-emitting layer.

FIG. 15 is a graph indicating the behavior of the compounds A, B and C illustrated in FIG. 9 when they were absorbed into the organic light-emitting layer. This graph was obtained as follows.

First, experimental elements to be used in the present research were prepared. More specifically, as is the case with the above-described organic EL element with the pressure reduction procedure, anodes, a hole injection layer, a hole transport layer and an organic light-emitting layer were laminated in the stated order on a substrate for each element. The experimental elements prepared here were three types of experimental elements whose organic light-emitting layers had 60 nm, 80 nm and 100 nm of film thickness, respectively. Subsequently, the respective substrates coated with the organic light-emitting layers were placed in the vacuum chamber, and then the vacuum pump was activated to reduce the internal pressure of the vacuum chamber, and the substrates were left in the chamber in this state for 20 minutes. The vacuum pump used in this research was a mechanical booster pump in which a diphenylamine-based compound was used in a portion of the pump that was connected to the inside of the vacuum chamber. Subsequently, the three types of experimental elements were respectively cut out such that they were the same in area when viewed from the sealing layer side, namely, such that the upper surfaces of the organic light-emitting layers were the same in area.

The respective organic light-emitting layers having passed through the pressure reduction procedure were heated in a helium atmosphere, and outgases from the heated organic light-emitting layers were collected by liquid nitrogen, and the collected gases were analyzed by the GC-MS. The equipment and measurement conditions and the like used in this analysis were the same as in the above-described GC-MS analysis. The amounts of the compounds A, B and C contained in the cut-out organic light-emitting layers were calculated based on the peak intensities of the compounds A, B and C, the peak intensity of toluene that was used as the reference material, the amounts of molecules of the compounds A, B and C, and the amount of molecules of toluene that were indicated by the obtained spectra, and the calculated amounts were represented by the graph (FIG. 15).

In FIG. 15, the horizontal axis represents the film thicknesses of the organic light-emitting layers, and the vertical axis represents the amounts (pmol/cm$^2$) of the compounds A, B and C contained in the cut-out organic light-emitting layers.

It should be noted here that each of the "amounts of the compounds A, B and C contained in the cut-out organic light-emitting layers" is a sum of the amount of molecules adhered to the surface of the cut-out organic light-emitting layer and the amount of molecules absorbed into the cut-out organic light-emitting layer. In FIG. 15, the amounts of the compounds A, B and C contained in the cut-out organic light-emitting layers are represented by rhombuses, squares and triangles, respectively. In the present example, it was tentatively checked whether or not the absorption into the film had occurred, by plotting the amounts of adhered molecules per unit area. It is regarded that, when only the adherence to the film surface occurred, there would be no correlation between the amount of adhered molecules and the film thickness.

However, as illustrated in FIG. 15, in all of the compounds A, B and C, the difference in amount depending on the film thickness of the organic light-emitting layer was observed. Since the cut-out organic light-emitting layers were the same in area, it is considered that the same amount of molecules adhered to the surface of each of the organic light-emitting layers. It is thus possible to consider that the difference among the amounts of the compounds A, B and C contained in the cut-out organic light-emitting layers reflects the difference in the amount of molecules absorbed into the cut-out organic light-emitting layer, namely, the difference in how easily the molecules are absorbed into the organic light-emitting layer.

FIG. 15 also shows a tendency common to all of the compounds A, B and C that the amount changes (increases or decreases) approximately linearly in correspondence with the change of the film thickness. It is also observed that, compared to the compounds B and C, the compound A greatly changes in amount in correspondence with the change of the film thickness. This indicates that, among the compounds A, B and C, the compound A is the most easily absorbed into the organic light-emitting layer. The reason for this is considered that, in the compound A, different from the compounds B and C, the aromatic ring has no substituent, and thus the molecules are relatively small and can easily be absorbed into the organic light-emitting layer.

Based on this comparison result, the compound A, which showed a remarkable behavior of being easily absorbed into the organic light-emitting layer, was used in the following research.

(Research on Heating Temperature and Heating Time)

First, it was checked whether or not the amount of the compound A contained in the cut-out organic light-emitting layers changed in correspondence with the change of the heating temperature or the heating time. In the following research, an organic light-emitting layer that is 80 nm in film thickness was used. The amount of the compound A contained in the cut-out organic light-emitting layer was calculated by the same method as that used to obtain the graph of FIG. 15. In the experiment described in the following, the film thickness was constant. Accordingly, the amount of adhered molecules per area has the same tendency as the amount of adhered molecules per unit volume.

Figure 16A:
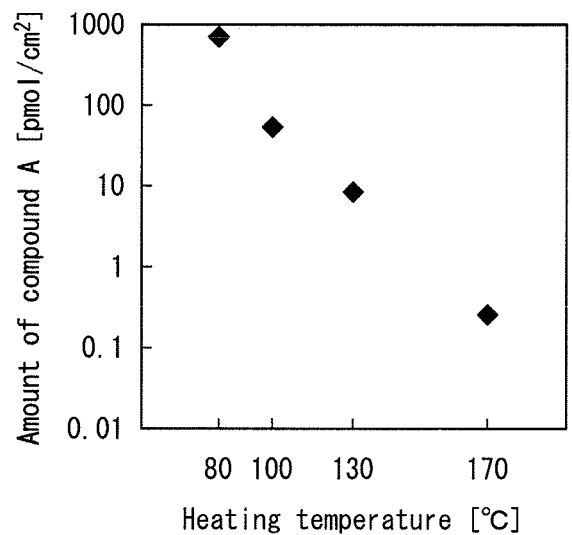
FIG. 16A is a graph showing how the amount (pmol/cm$^2$) of the compound A changes in correspondence with the change of the heating temperature.

FIG. 16A is a graph showing how the amount (pmol/cm$^2$) of the compound A changes in correspondence with the change of the heating temperature. The heating procedure was performed at 80° C., 100° C., 130° C., and 170° C. of heating temperature. The heating time was 5 minutes for each of the heating temperatures. As illustrated in FIG. 16A, the amount decreased with the increase of the heating temperature.

Figure 16B:
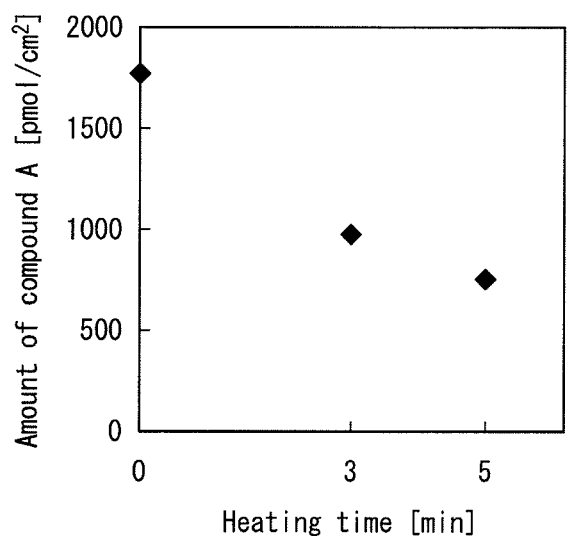
FIG. 16B is a graph showing how the amount (pmol/cm$^2$) of the compound A changes in correspondence with the change of the heating time.

FIG. 16B is a graph showing how the amount (pmol/cm$^2$) of the compound A changes in correspondence with the change of the heating time. The heating procedure was performed with 0 minutes, 3 minutes, and 5 minutes of heating time. The heating procedure was 80° C. for each of the heating times. As illustrated in FIG. 16B, the amount decreased with the increase of the heating time.

From the results illustrated in FIGS. 16A and 16B, it is found that it is possible to control the amount of the compound A contained in the organic light-emitting layer by changing the heating temperature and the heating time.

(Amount of Compound A Per Unit Volume to Obtain Effect of Improving Light-Emitting Characteristics)

Figure 17:
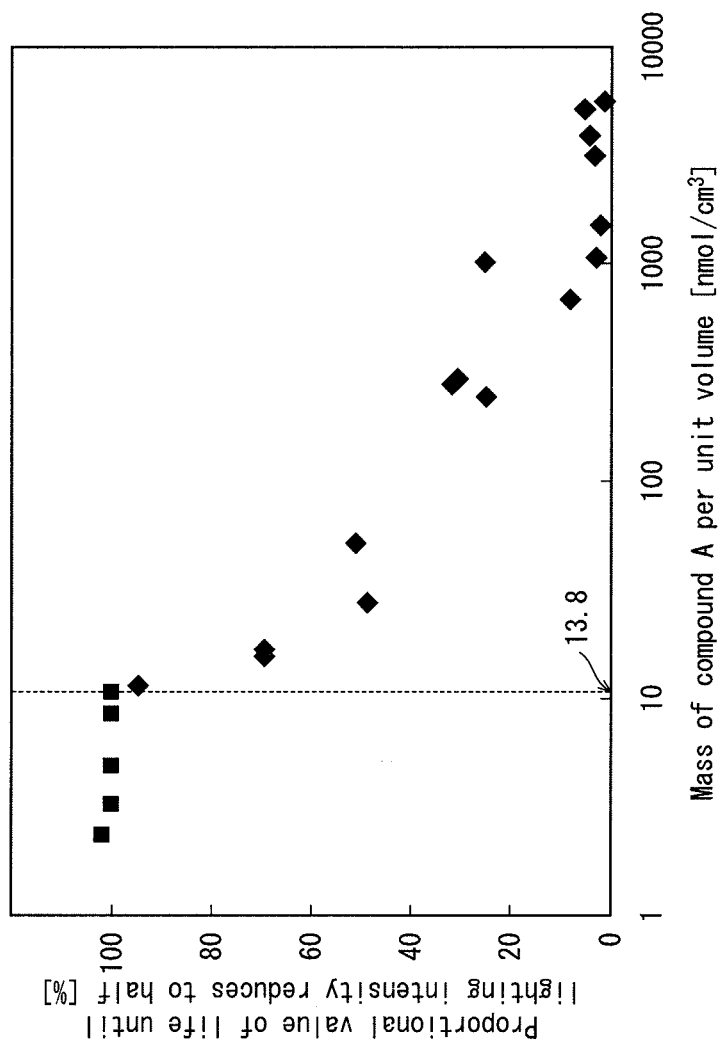
FIG. 17 is a graph showing how the time until the lighting intensity reduces to half changes in correspondence with the change of the amount of the compound A per unit volume.

Next, by varying the heating temperature and the heating time, various trial models of organic EL elements having organic light-emitting layers that contain different amounts of compound A per unit volume were manufactured. The time until the lighting intensity reduces to half was measured for each of the manufactured trial models of organic EL elements, by the same method as that of FIGS. 8 and 14. The results are illustrated in FIG. 17. In this research, the organic light-emitting layers each having 80 nm of film thickness were cut out such that the upper surfaces thereof were the same in area, and the amount of the compound A contained in each of the cut-out organic light-emitting layers was varied so that the amount of the compound A per unit volume varied. The amount of the compound A per unit volume was calculated based on the amount of the compound A contained in the organic light-emitting layer, area of the upper surface of the organic light-emitting layer, and the film thickness of the organic light-emitting layer.

FIG. 17 is a graph showing how the life until the lighting intensity reduces to half changes in correspondence with the change of the amount of the compound A per unit volume. The horizontal axis represents the amount (nmol/cm$^3$) of the compound A per unit volume, and the vertical axis represents the proportional values of the time until the lighting intensity reduces to half. The values of the vertical axis are proportional values, wherein the life until the lighting intensity reduces to half of the organic EL element that does not contain the compound A in the organic light-emitting layer, namely, the organic EL element that has not passed through the pressure reduction procedure, is set to 100(%).

As illustrated in FIG. 17, according to the results of the experiment, the proportional value of the time until the lighting intensity reduces to half was 100(%) or more when the amount of the compound A per unit volume was 13.8 nmol/cm$^3$ or less (represented by squares in FIG. 17). On the other hand, the proportional value of the time until the lighting intensity reduces to half was less than 100(%) when the amount of the compound A per unit volume was more than 13.8 nmol/cm$^3$ (represented by rhombuses in FIG. 17). In this experiment, the smallest value of the amount of the compound A per unit volume was 3.0 nmol/cm$^3$, and the proportional value of the time until the lighting intensity reduces to half corresponding to the smallest value of the amount was 102(%). Note that the purification procedure for this case was performed at 190° C. of heating temperature for 10 minutes of heating time.

From the tendency read from FIG. 17, the proportional value of the life until the lighting intensity reduces to half is expected to be 100(%) or more even when the amount of the compound A per unit volume is less than 3.0 nmol/cm$^3$. That is to say, the proportional value of the time until the lighting intensity reduces to half is expected to be 100(%) or more when the content of diphenylamine, which has flown from the vacuum pump into the vacuum chamber during the pressure reduction procedure and has been absorbed into the organic light-emitting layer, is in a range from more than 0 nmol/cm$^3$ to 13.8 nmol/cm$^3$.

It should be noted here that an object of the present embodiment is an organic EL element that takes a longer time until the lighting intensity reduces to half than an organic EL element that has passed through only the pressure reduction procedure (an organic EL element that has passed through the pressure reduction procedure, but not the purification procedure). In other words, an organic EL element, which takes a long time until the lighting intensity reduces to half although it has passed through the pressure reduction procedure, is assumed to have passed through the purification procedure, and such an organic EL element is an object of the present embodiment.

As explained with reference to FIG. 8, an organic EL element that has passed through only the pressure reduction procedure takes a shorter time until the lighting intensity reduces to half than an organic EL element that has not passed through the pressure reduction procedure. Since the time until the lighting intensity reduces to half of the organic EL element that has not passed through the pressure reduction procedure is 100(%), the proportional value of the life until the lighting intensity reduces to half of organic EL element that has passed through only the pressure reduction procedure is less than 100(%). That is to say, an object of the present embodiment is an organic EL element whose proportional value of the time until the lighting intensity reduces to half is 100(%) or more.

FIG. 17 illustrates the relationship between the time until the lighting intensity reduces to half and the amount of the compound A per unit volume. The following discusses the relationship between the life until the lighting intensity reduces to half and the heating temperature and heating time in the purification procedure.

Figure 18:
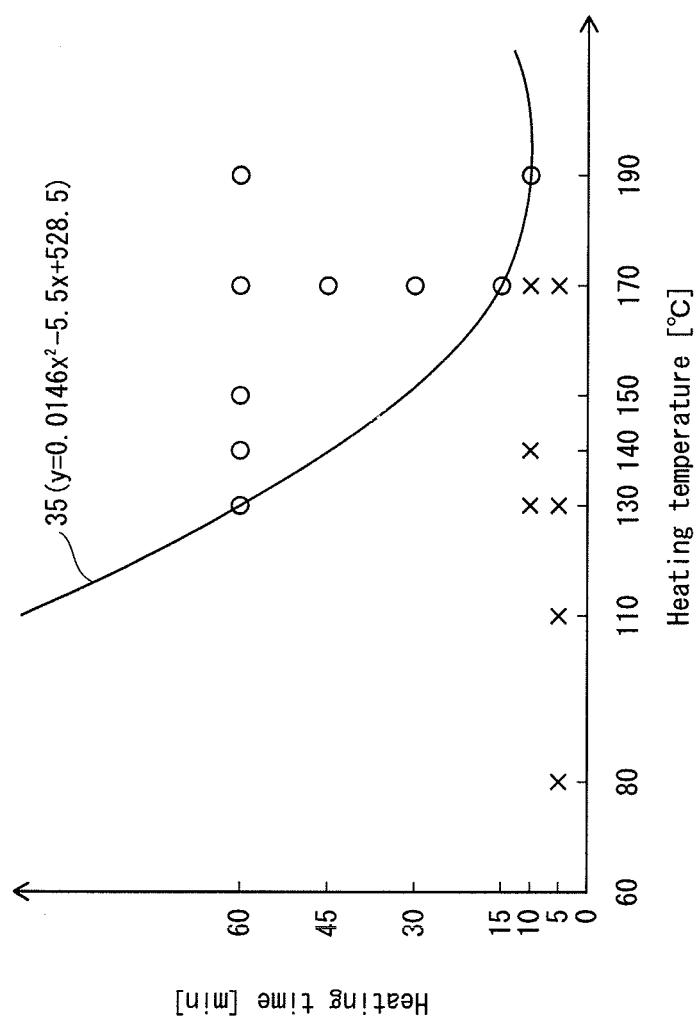
FIG. 18 is a graph illustrating the relationship between the time until the lighting intensity reduces to half and the heating temperature and heating time in the purification procedure.

FIG. 18 is a graph illustrating the relationship between the life until the lighting intensity reduces to half and the heating temperature and heating time in the purification procedure. The horizontal axis represents the heating temperature (° C.), and the vertical axis represents the heating time (min). In FIG. 18, the sign ○ indicates the organic EL elements whose proportional value of the time until the lighting intensity reduces to half is 100(%) or more for the heating conditions, and the sign × indicates the organic EL elements whose proportional value of the time until the lighting intensity reduces to half is less than 100(%).

The following briefly explains how to read the graph of FIG. 18. For one instance, a sign × is found in correspondence with 80° C. of heating temperature and 5 minutes of heating time. This indicates that the proportional value of the time until the lighting intensity reduces to half of an organic EL element, which had an organic light-emitting layer that had passed through the purification procedure under these heating conditions, was less than 100(%). As another instance opposite to this, a sign ○ is found in correspondence with 150° C. of heating temperature and 60 minutes of heating time. This indicates that the proportional value of the time until the lighting intensity reduces to half of an organic EL element, which had an organic light-emitting layer that had passed through the purification procedure under these heating conditions, was 100(%) or more.

As indicated by FIG. 18, the whole region of the graph is divided into two regions: a region where the proportional value of the time until the lighting intensity reduces to half is 100(%) or more; and a region where the proportional value of the time until the lighting intensity reduces to half is less than 100(%). The inventors considered that the boundary between the two regions could be represented by a function, regarding the graph of FIG. 18 as an x-y orthogonal coordinate system, wherein its x axis represents the heating temperature (° C.) and its y axis represents the heating time (min).

The inventors thus drew a quadratic curve 35 by a nonlinear least square method based on pairs of x coordinate value and y coordinate value in the x-y orthogonal coordinate system that are on the boundary of the region with sign where the proportional value of the life until the lighting intensity reduces to half is 100(%) or more, and correspond to the following cases: <1> 130° C. of heating temperature and 60 minutes of heating time ((x,y)=(130,60); <2> 170° C. of heating temperature and 15 minutes of heating time ((x,y)=(170,15); and <3> 190° C. of heating temperature and 10 minutes of heating time ((x,y)=(190,10). As a result of this, the quadratic curve 35 represented by a function y=0.0146x$^2$−5.5x+528.54, as illustrated in FIG. 18, was obtained. As understood from this, when it is in the region above the quadratic curve 35 in the x-y orthogonal coordinate system (the region including the quadratic curve 35), the proportional value of the time until the lighting intensity reduces to half is 100(%) or more.

That is to say, it is possible to define that the proportional value of the time until the lighting intensity reduces to half can be set to 100(%) or more by selecting, in an x-y orthogonal coordinate system with its x axis representing the heating temperature (° C.) and its y axis representing the heating time (min), a combination of the heating temperature and the heating time of the purification procedure, from pairs of x coordinate value and y coordinate value that belong to the region above a curve represented by a quadratic function y=0.0146x$^2$−5.5x+528.54 in the x-y orthogonal coordinate system (inclusive of those on the curve).

That is to say, it is possible to set the proportional value of the time until the lighting intensity reduces to half to 100(%) or more by selecting any combination of x coordinate value and y coordinate value that belongs to the region above the quadratic curve 35 (inclusive of one on the quadratic curve 35). However, the organic light-emitting layer may be deteriorated when it is heated at a high temperature. In view of this, the temperature is desirably at least 130° C. and at most 180° C., and is more desirably at least 150° C. and at most 170° C. Also, a long heating time may lead to a decomposition of the organic light-emitting layer, or to a reduction of the manufacturing efficiency of the organic EL element. In view of these, the heating time is desirably 60 minutes.

[Organic EL Display Apparatus]

Figure 19:
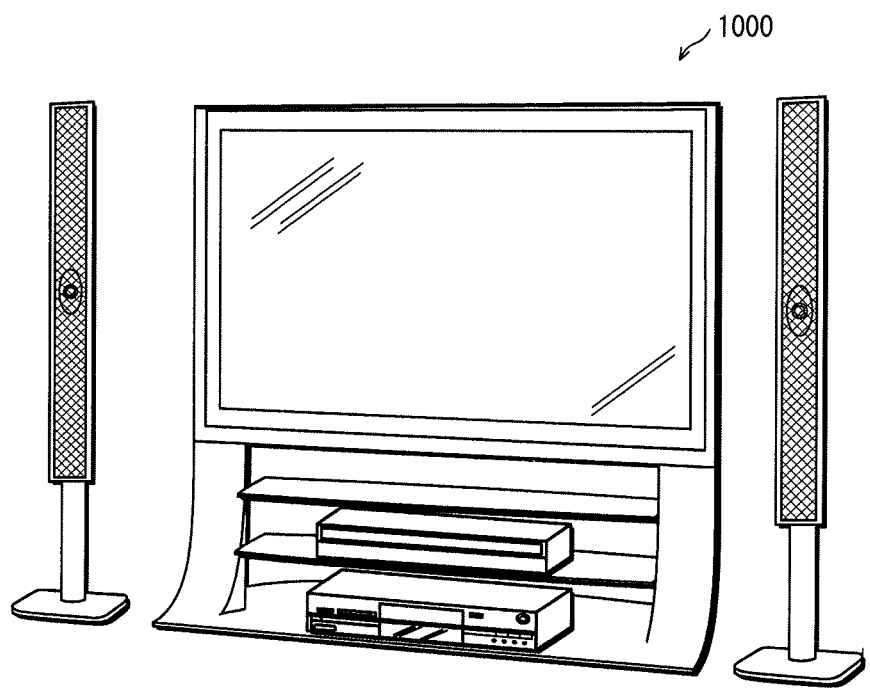
FIG. 19 is a perspective view of an organic EL display apparatus, etc. in one aspect of the present invention.

FIG. 19 is a perspective view of an organic EL display apparatus, etc. in one aspect of the present invention. As illustrated in FIG. 19, an organic EL display apparatus 1000 is an organic EL display and includes the organic EL display panel 10 described above.

Figure 20:
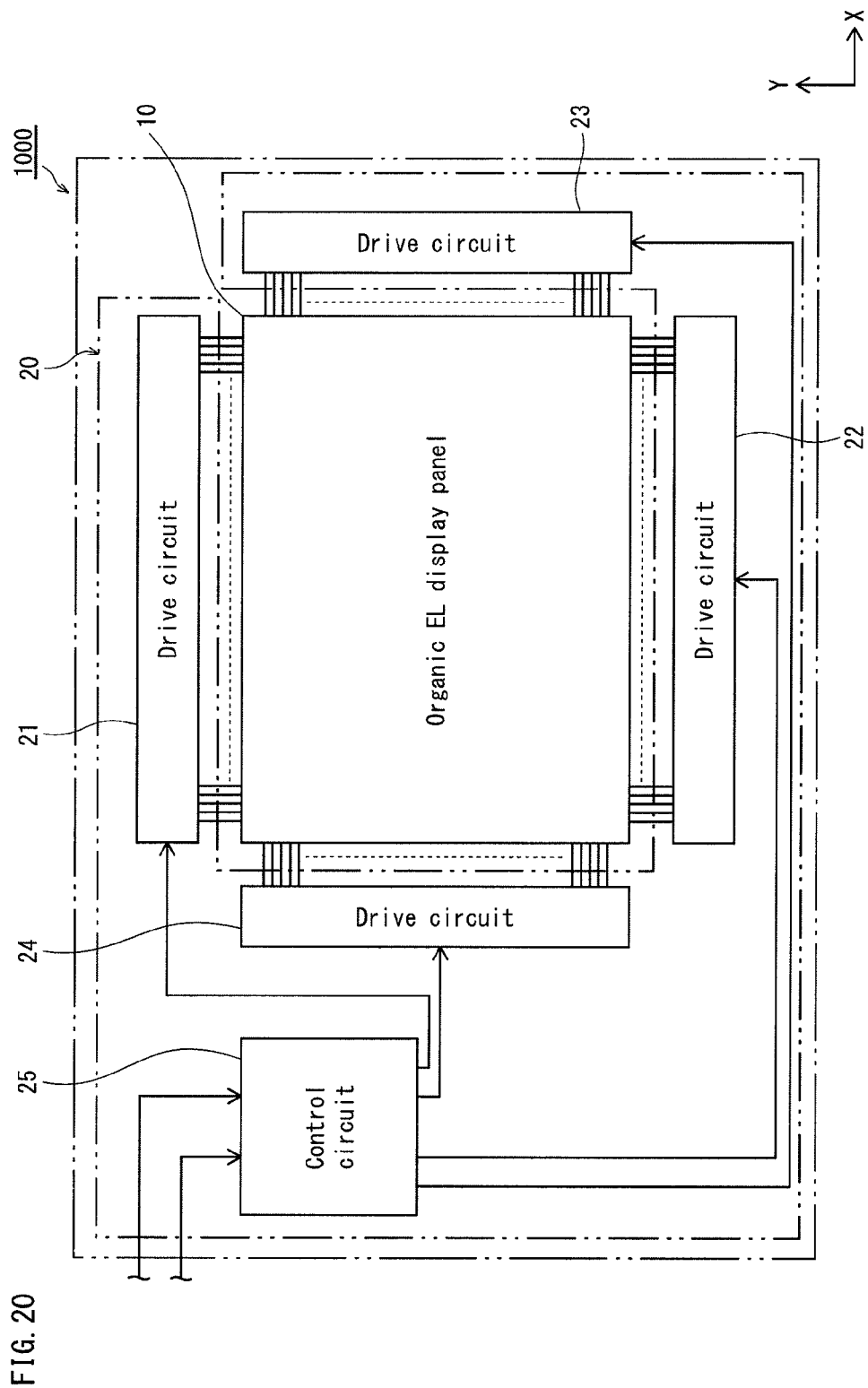
FIG. 20 is a diagram illustrating the entire structure of the organic EL display apparatus 1000 in one aspect of the present invention.

FIG. 20 is a diagram illustrating the entire structure of the organic EL display apparatus 1000 in one aspect of the present invention. As illustrated in FIG. 20, an organic EL display apparatus 1000 includes the organic EL display panel 10 and a drive controller 20 connected thereto. The drive controller 20 is composed of four drive circuits 21-24 and a control circuit 25. Note that in the actual organic EL display apparatus 1000, the placement and connection of the drive controller 20 to the organic EL display panel 10 are not limited to this example.

The organic EL element, which constitutes the organic EL display panel 10 included in the organic EL display apparatus 1000, includes the organic light-emitting layer that has been formed by being passed through the above-described purification procedure. Thus the organic light emitting layer has excellent light-emitting characteristics, and the organic EL display apparatus 1000 has excellent image quality.

[Organic EL Light-Emitting Apparatus]

Figure 21A:
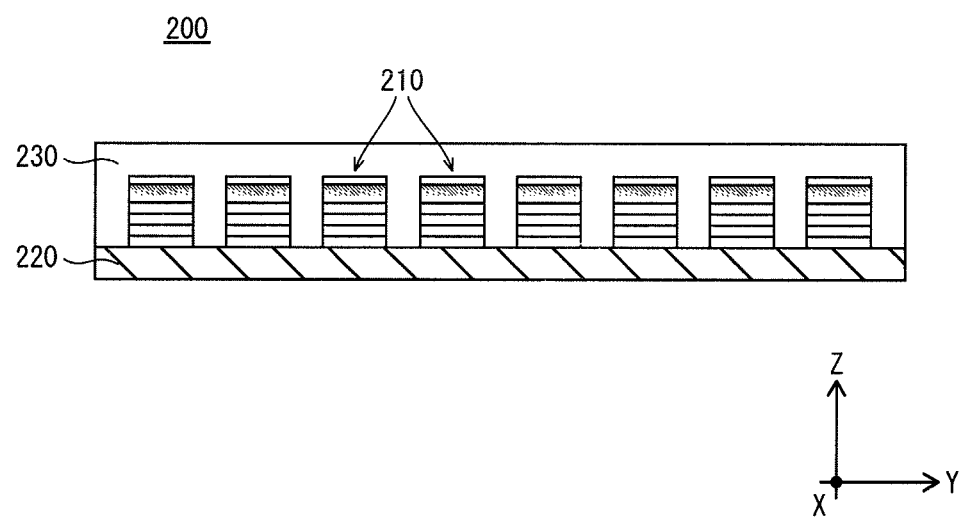
FIGS. 21A and 21B are diagrams illustrating an organic EL light-emitting apparatus 200 in one aspect of the present invention.
Figure 21B:
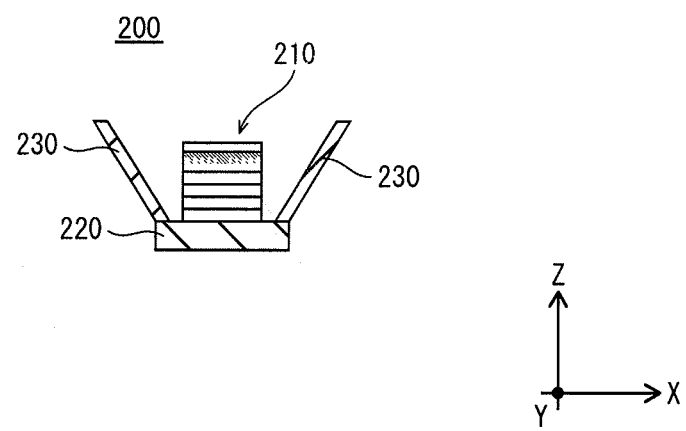

FIGS. 21A and 21B are diagrams illustrating an organic EL light-emitting apparatus 200 in one aspect of the present invention, wherein FIG. 21A is a longitudinal section, and FIG. 21B is a transverse section. As illustrated in FIGS. 21A and 21B, the organic EL light-emitting apparatus 200 includes: a plurality of organic EL elements 210 formed by the manufacturing method according to one aspect of the present invention; a base 220 with the organic EL elements 210 implemented on the upper surface thereof; and a pair of reflectors 230 that are mounted so as to sandwich the organic EL elements 210. The organic EL elements 210 are each electrically connected to a conductive pattern (not illustrated) formed on the base 220, and emit light by driving power supplied from the conductive pattern. Distribution of part of the light emitted from the organic EL elements 210 is controlled by the reflectors 230.

Each of the organic EL elements 210 provided in the organic EL light-emitting apparatus 200 includes the organic light-emitting layer that has been formed by being passed through the above-described purification procedure. Thus the organic EL light-emitting apparatus 200 has excellent light-emitting characteristics.

[Modifications/Others]

Up to now, the present invention has been described through the exemplary embodiments. However, the present invention is not limited to the above-described embodiments. For example, the following modifications may be considered.

(1) As described above with reference to FIG. 17, an organic EL element, which is provided with an organic light-emitting layer that has a diphenylamine content in a range from 3 nmol/cm$^3$ to 13.8 nmol/cm$^3$, has more excellent light-emitting characteristics than an organic EL element that has an organic light-emitting layer that has passed through the pressure reduction procedure, but not the purification procedure. That is to say, an organic EL element comprising: a substrate with a first electrode formed on an upper surface thereof; an organic light-emitting layer formed above the substrate; and a second electrode formed above the organic light-emitting layer, wherein the organic light-emitting layer has a diphenylamine content in a range from 3.0 nmol/cm$^3$ to 13.8 nmol/cm$^3$, has excellent light-emitting characteristics.

As a method for manufacturing such an organic EL element that has excellent light-emitting characteristics, the above embodiment discloses causing the organic light-emitting layer to absorb diphenylamine by performing the pressure reduction procedure by using a vacuum apparatus that uses diphenylamine in a portion of the vacuum pump that is connected to the inside of the vacuum chamber. However, the present invention is not limited to this method. Other than this, there are, for example, a method for mixing diphenylamine into the organic light-emitting layer material in advance so that the organic light-emitting layer material has the above-described content of diphenylamine, and a method for sealing, in advance, a gas containing vapor of diphenylamine in the vacuum chamber or in the connector connecting the vacuum pump with the vacuum chamber. Furthermore, diphenylamine to be absorbed into the organic light-emitting layer may not necessarily be for use as an antioxidant, but may be for other uses.

(2) In the explanation with reference to FIG. 18, the heating condition such as the heating temperature set for the purification procedure is selected from among pairs of x coordinate value and y coordinate value that belong to the region above the quadratic curve 35 (the region including the quadratic curve 35) in the x-y orthogonal coordinate system. However, the quadratic curve 35 is drawn for the sake of demarcation between a region for the proportional value of the life until the lighting intensity reduces to half being 100(%) or more and a region for the proportional value of the life until the lighting intensity reduces to half being less than 100(%). Thus, not limited to the pairs of x coordinate value and y coordinate value that accurately belong to the region above the quadratic curve 35, but the heating condition may be selected from among pairs of x coordinate value and y coordinate value that belong to a region slightly under the quadratic curve 35, for the proportional value of the life until the lighting intensity reduces to half to be 100(%) or more.

(3) The manufacturing method of an organic EL display panel described in the above embodiment is only an example. However, the present invention is not limited to this. For example, a layer described in the above as being formed by forming a film by the vacuum film-forming method may be formed by forming a film by the solution-deposition-type film forming method, or, conversely, a layer described in the above as being formed by forming a film by the solution-deposition-type film forming method may be formed by forming a film by the vacuum film-forming method.

(4) In the present invention, the ITO layer, hole injection layer, hole transport layer, bank, and sealing layer are not indispensable structural elements. The present invention is applicable to organic EL elements that do not include these structural elements. Conversely, the present invention is applicable to organic EL elements that include other structural elements such as a hole blocking layer. In connection with this, on or above the substrate that is prepared in the preparation procedure, the ITO layer, hole injection layer, hole transport layer, and bank may not necessarily be formed. Furthermore, when an organic EL element not including a sealing layer is formed, of course the procedure for forming the sealing layer may be omitted.

(5) According to the above-described embodiment, the "organic light-emitting layer material applied film" turns into the organic light-emitting layer by passing through the drying procedure. As described above, however, vacuum-pump-derived materials may adhere to the organic light-emitting layer material applied film that is in the middle of the drying. That is to say, the "organic light-emitting layer material applied film" may indicate an organic light-emitting layer that has been completed as the drying of the organic light-emitting layer material has been completed, or may indicate an organic light-emitting layer material applied film that is in the middle of the drying.

(6) According to the above-described embodiment, the drying procedure for drying the organic light-emitting layer material is the pressure reduction procedure. However, the present invention is not limited to this. For example, when a preservation procedure is performed to preserve an intermediate product of the organic EL element in a vacuum state for the period after the completion of the organic light-emitting layer and before the next procedure, the preservation procedure is also regarded as the pressure reduction procedure, and the vacuum-pump-derived materials may fly during the preservation procedure. That is to say, the "applied film that has passed through the pressure reduction procedure" may indicate an applied film in the state immediately after the application of the organic light-emitting layer material until the applied film is completely dried, or indicate an applied film that has been dried completely, namely, the organic light-emitting layer. The above-described heating method can be applied even to the case where the vacuum-pump-derived materials have flown during the preservation procedure.

Note that, during the drying procedure, "the substrate in the state immediately after the application of the organic light-emitting layer material until the applied film is completely dried" is housed in the vacuum chamber. On the other hand, during the preservation procedure, "the substrate after completion of the organic light-emitting layer with drying of the applied film completed" is housed in the vacuum chamber.

Furthermore, the pressure reduction procedure is not limited to the drying procedure and the preservation procedure, but may be any procedure in which the substrate after the application of the organic light-emitting layer material is placed under vacuum, among procedures that are performed during a period after the application of the organic light-emitting layer material and before the procedure of forming a layer on or above the upper surface of the organic light-emitting layer.

Also, as described in the embodiment above, the purification method used in the purification procedure is not limited to heating. As another example of the purification method, the upper surface of the organic light-emitting layer 16 may be purged with an inert gas, such as nitrogen, or dry air, and the substrate 11 may be preserved in the vacuum chamber under vacuum by setting the target vacuum level to at least 15 Pa, or as a further example of the purification method, the substrate 11 may be cleaned with IPA (isopropyl alcohol) or the like.

(7) The "diphenylamine-based compound" means a compound having a diphenylamine skeleton. The compound having a diphenylamine skeleton is diphenylamine, a derivative of diphenylamine, etc. FIG. 9, portions (b) and (c) illustrate diphenylamine-based compounds each having one substituent. However, in the present invention, the number of substituents is not particularly limited. Furthermore, the positions of substituents are not limited to those illustrated in FIG. 9, portions (b) and (c).

(8) In the above-described embodiment, diphenylamine, which has the simpliest structure among the diphenylamine-based compounds, is studied. Other diphenylamine-based compounds may be studied similarly to determine the amount per unit volume, heating temperature, and heating time that produce the effect of improving the light-emitting characteristics.

(9) The mechanism illustrated in FIG. 10, by which the time until the lighting intensity reduces to half is shortened, is a mechanism that is assumed for a case where the electron injection layer is not formed between the electron transport layer and the cathode. The following describes the mechanism for a case where the electron injection layer is formed between the electron transport layer and the cathode.

In the case where the electron injection layer has not been formed, compound A is assumed to supply hydrogen atoms to the electron transport material X in the radical anion state. On the other hand, in the case where the electron injection layer has been formed, what supplies hydrogen atoms to the electron transport material X in the radical anion state is assumed to be the material Y that constitutes the organic light-emitting layer to which electrons have been supplied from the electron ejection layer, or a residual solvent, or a small amount of water that has mixed into the organic EL element during the manufacturing process, or the like. When hydrogen atoms are supplied, the material Y that constitutes the organic light-emitting layer to which electrons have been supplied from the electron ejection layer, or the residual solvent, or the water, or the like is assumed to turn into the radical anion state.

(10) The mechanism illustrated in FIG. 10, by which the time until the lighting intensity reduces to half is shortened, is merely one example. The life until the lighting intensity reduces to half may be shortened by a mechanism different from the mechanism illustrated in FIG. 10.

(11) As described in the embodiment above, in general, the vacuum pump and the vacuum chamber are connected by a connector. The vacuum sealing material, which is one example of the vacuum-pump-derived materials, is used in a portion of the vacuum pump that is connected to the connector. That is to say, the vacuum sealing material is included in the vacuum pump, not in the connector.

(12) In the embodiment described above, an antioxidant added to the lubricant, an antioxidant added to the vacuum sealing material, and in particular a chain stopping agent are taken as examples of the vacuum-pump-derived materials that adhere to the organic light-emitting layer when the pressure reduction procedure is performed. However, other types of antioxidants may be the vacuum-pump-derived materials. Also, a material, other than antioxidants, that is added to the lubricant or the vacuum sealing material may be a vacuum-pump-derived material. Furthermore, a material, other than the lubricant and the vacuum sealing material, that is used in the portion of the vacuum pump that is connected to the inside of the vacuum chamber may fly into the vacuum chamber. That is to say, the present invention is broadly applicable to materials that are adhered to or absorbed into the organic light-emitting layer when the pressure reduction procedure is performed thereon, and have a certain function to improve the light-emitting characteristics.

(13) In the embodiment described above, the manufacturer who performs the purification procedure prepares a substrate with the organic light-emitting layer material applied film formed thereon by applying an organic light-emitting layer material on the substrate. However, the present invention is not limited to this. For example, the present invention is applicable to a case where the manufacturer who performs the purification procedure buys the substrate with the organic light-emitting layer material applied film formed thereon from another manufacturer.

(14) In the embodiment described above, the hole injection layer is formed covering the entire region of the upper surface of the substrate. However, the present invention is not limited to this structure. The hole injection layer may be formed only on the ITO layers. Alternatively, the hole injection layer may be formed to cover only the side surfaces and the upper surface of the ITO layer.

(15) When the anodes are formed from a silver (Ag)-based material, it is preferable that the ITO layer is formed on the anodes as in the above-described embodiment. When the anodes are formed from an aluminum-based material, the anodes may be formed in a single-layer structure by omitting the ITO layer.

(16) The embodiment describes an organic EL display panel in which a plurality of organic EL elements are integrated on a substrate as sub-pixels. However, not limited to this example, each organic EL element may be used in a singular form. For example, in a lighting apparatus, the organic EL elements are used in a singular form.

(17) In the embodiment described above, the organic EL display panel is a full-color display panel based on light emission of colors R, G and B. However, the present invention is not limited to this. The present invention is applicable to an organic EL display panel in which are arranged a plurality of organic EL elements that each emit a single color of light among R, G, B, white and the like. The present invention is also applicable to a monochrome organic EL display panel in which are arranged a plurality of organic EL elements that emit the same single color of light.

(18) In the embodiment described above, an organic material is used as the bank material. However, not limited to this, an inorganic material may be used. In that case, the bank material layer may be formed by the solution-deposition-type film forming method, as in the case where an organic material is used. Also, in the organic EL display panel described above, a line bank structure is adopted and a plurality of linear banks are formed in stripes to partition the organic light-emitting layer into linear portions. However, the present invention is not limited to this. For example, a so-called pixel bank structure may be adopted, in which the bank is formed in the lattice shape such that it surrounds each of the plurality of sub-pixels.

(19) The embodiment is described by taking as one example a manufacturing method of a top-emission-type organic EL display panel. However, the present invention is not limited to this. For example, the present invention is applicable to a manufacturing method of a so-called bottom-emission-type organic EL display panel in which the display surface is provided on the substrate side (see, for example, the substrate 11 illustrated in FIG. 1). Furthermore, the present invention is applicable to a manufacturing method of an organic EL display panel of a double-sided light-emission type in which both the anodes and the cathode are made of a transparent conductive material, and the light is emitted from both the anode side and the cathode side.

(20) The above embodiment describes an organic EL element in which the first electrode is the anodes, and the second electrode is the cathode. However, the present invention is not limited to this. The first electrode may be the cathode, and the second electrode may be the anodes.

(21) In the embodiment described above, specific materials, numerals and the like are used, but they are used merely as preferable examples. The present invention is not limited thereto. Furthermore, the present invention is capable of modification in various obvious respects, all without departing from the technical concept of the invention. It should also be noted that the accompanying drawings are not to scale. It should further be noted that the sign –, when used to represent a numerical range, indicates that the numerical range includes the numerical values provided at both ends of the sign.

INDUSTRIAL APPLICABILITY

The present invention is suitable for use in, for example, manufacturing an organic EL element that is for use in various types of displays at home, public facilities or business, television apparatuses, and mobile electronic apparatuses.

REFERENCE SIGNS LIST 10 organic EL display panel
11 substrate
12 anode
13 ITO layer
14 hole injection layer
15 bank
15a opening
16 organic light emitting layer
16a organic light emitting layer material applied film
17 electron transport layer
18 cathode
19 sealing layer
20 drive controller
21-24 drive circuits
25 control circuit
26 adhered substances 27 absorbed substances
28 interface region between organic light-emitting layer and electron transport layer
29 vacuum chamber
30 vacuum pump
31, 32 exhaust pipe
33 vacuum-pump-derived material
34 substrate with organic light emitting layer material applied film formed thereon
35 quadratic curve
200 organic EL light-emitting apparatus
210 organic EL element
220 base
230 reflector
100 sub-pixel
1000 organic EL light-emitting apparatus

The invention claimed is:

1. A method for manufacturing an organic EL element, the method comprising:
reducing an internal pressure of a vacuum chamber by a vacuum pump connected thereto in a state where a substrate with an applied film formed thereon is placed in the vacuum chamber, the applied film having been formed by applying a material of an organic light-emitting layer to the substrate; and
purifying the applied film having passed through the reducing the internal pressure of the vacuum chamber, wherein
diphenylamine is used in a portion of the vacuum pump that is connected to an inside of the vacuum chamber,
the reducing the internal pressure of the vacuum chamber is performed such that molecules of diphenylamine fly from the vacuum pump into the vacuum chamber and some of the molecules are taken into the applied film, and
the purifying is performed so that content of diphenylamine in the applied film is in a range from more than 0 nmol/cm$^3$ to 13.8 nmol/cm$^3$.

2. The method according to claim 1, wherein
during the purifying, the applied film having passed through the reducing the internal pressure of the vacuum chamber is heated so that content of diphenylamine in the applied film is in the range from more than 0 nmol/cm$^3$ to 13.8 nmol/cm$^3$.

3. The method according to claim 2, wherein
during the purifying, the applied film having passed through the reducing the internal pressure of the vacuum chamber is heated so that content of diphenylamine in the applied film is at least 3.0 nmol/cm$^3$.

4. The method according to claim 2, wherein
in an x-y orthogonal coordinate system with an x axis representing heating temperature in ° C. set for the purifying, and with a y axis representing heating time in minutes set for the purifying,
a combination of a heating temperature and a heating time set for the purifying is selected from among pairs of x coordinate value and y coordinate value that belong to a region above a curve represented by a quadratic function $y=0.0146x^2-5.5x+528.54$, the region including the curve.

5. The method according to claim 4, wherein
during the purifying, the heating temperature is at least 130° C. and at most 180° C., and the heating time is at most 60 minutes.

6. The method according to claim 5, wherein
during the purifying, the heating temperature is at most 170° C.

7. The method according to claim 1, wherein
diphenylamine contained in the organic light-emitting layer functions as a hole transporting material that promotes at least transportation of holes.

8. The method according to claim 1, wherein
a lubricant has been applied to a driving unit that drives the vacuum pump, the lubricant containing a lubricating component and an antioxidant for preventing the lubricating component from oxidizing, and
diphenylamine is contained in the lubricant as the antioxidant.

9. The method according to claim 1, wherein
the vacuum pump is connected with the vacuum chamber by a connector, a vacuum sealing material being inserted between the connector and the vacuum chamber, and the vacuum sealing material containing a resin material and an antioxidant for preventing the resin material from oxidizing, and
diphenylamine is contained in the vacuum sealing material as the antioxidant.

10. An organic EL element comprising:
a substrate with a first electrode formed on an upper surface thereof;
an organic light-emitting layer formed above the substrate; and
a second electrode formed above the organic light-emitting layer, wherein
the organic light-emitting layer has a diphenylamine content in a range from 3.0 nmol/cm$^3$ to 13.8 nmol/cm$^3$.

11. An organic EL display panel including an organic EL element manufactured by the method recited in claim 1.

12. An organic EL display apparatus including an organic EL element manufactured by the method recited in claim 1.

13. An organic EL light-emitting apparatus including an organic EL element manufactured by the method recited in claim 1.

* * * * *